(12) United States Patent
Nagase et al.

(10) Patent No.: US 7,193,890 B2
(45) Date of Patent: Mar. 20, 2007

(54) MAGNETORESISTIVE EFFECT DEVICE, MAGNETIC RANDOM ACCESS MEMORY, AND MAGNETORESISTIVE EFFECT DEVICE MANUFACTURING METHOD

(75) Inventors: Toshihiko Nagase, Sagamihara (JP); Sumio Ikegawa, Musashino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/262,791

(22) Filed: Nov. 1, 2005

(65) Prior Publication Data
US 2006/0126371 A1 Jun. 15, 2006

(30) Foreign Application Priority Data
Nov. 2, 2004 (JP) ............................. 2004-319604

(51) Int. Cl.
*G11C 11/00* (2006.01)
(52) U.S. Cl. .................... 365/158; 365/145; 365/171; 257/E21.665
(58) Field of Classification Search ................ 365/158, 365/145, 171; 257/E21.665
See application file for complete search history.

(56) References Cited

U.S. PATENT DOCUMENTS

| | | | | |
|---|---|---|---|---|
| 5,801,984 A | * | 9/1998 | Parkin ...................... | 365/158 |
| 5,936,293 A | * | 8/1999 | Parkin ...................... | 257/422 |
| 6,205,052 B1 | * | 3/2001 | Slaughter et al. ........... | 365/173 |

| | | | | |
|---|---|---|---|---|
| 2004/0032318 A1 | * | 2/2004 | Mori et al. ............... | 338/32 R |

FOREIGN PATENT DOCUMENTS

JP 2004-128237 4/2004

OTHER PUBLICATIONS

J. C. S. Kools, et al., "Effect of finite magnetic film thickness on Néel coupling in spin valves", Journal of Applied Physics, vol. 85, No. 8, Apr. 15, 1999, pp. 4466-4468.

* cited by examiner

Primary Examiner—Richard T. Elms
Assistant Examiner—Eric J. Wendler
(74) Attorney, Agent, or Firm—Oblon, Spivak, McClelland, Maier & Neustadt, P.C.

(57) ABSTRACT

A magnetoresistive effect device includes a first ferromagnetic layer having a fixed magnetization direction and having magnetic moment m1 per unit area. A nonmagnetic layer contacts with the first ferromagnetic layer and has an amplitude h1 of roughness of an interface between the nonmagnetic layer and the first ferromagnetic layer. A second ferromagnetic layer contacts with the nonmagnetic layer, has a fixed magnetization direction, has magnetic moment m2 per unit area which is smaller than the magnetic moment m1, and has an amplitude h2 of roughness of an interface between the second ferromagnetic layer and the nonmagnetic layer. A barrier layer contacts with the second ferromagnetic layer, and has an amplitude h3, which is smaller than the amplitudes h1 and h2, of roughness of an interface between the barrier layer and the second ferromagnetic layer. A third ferromagnetic layer contacts with the barrier layer and has a variable magnetization direction.

17 Claims, 14 Drawing Sheets

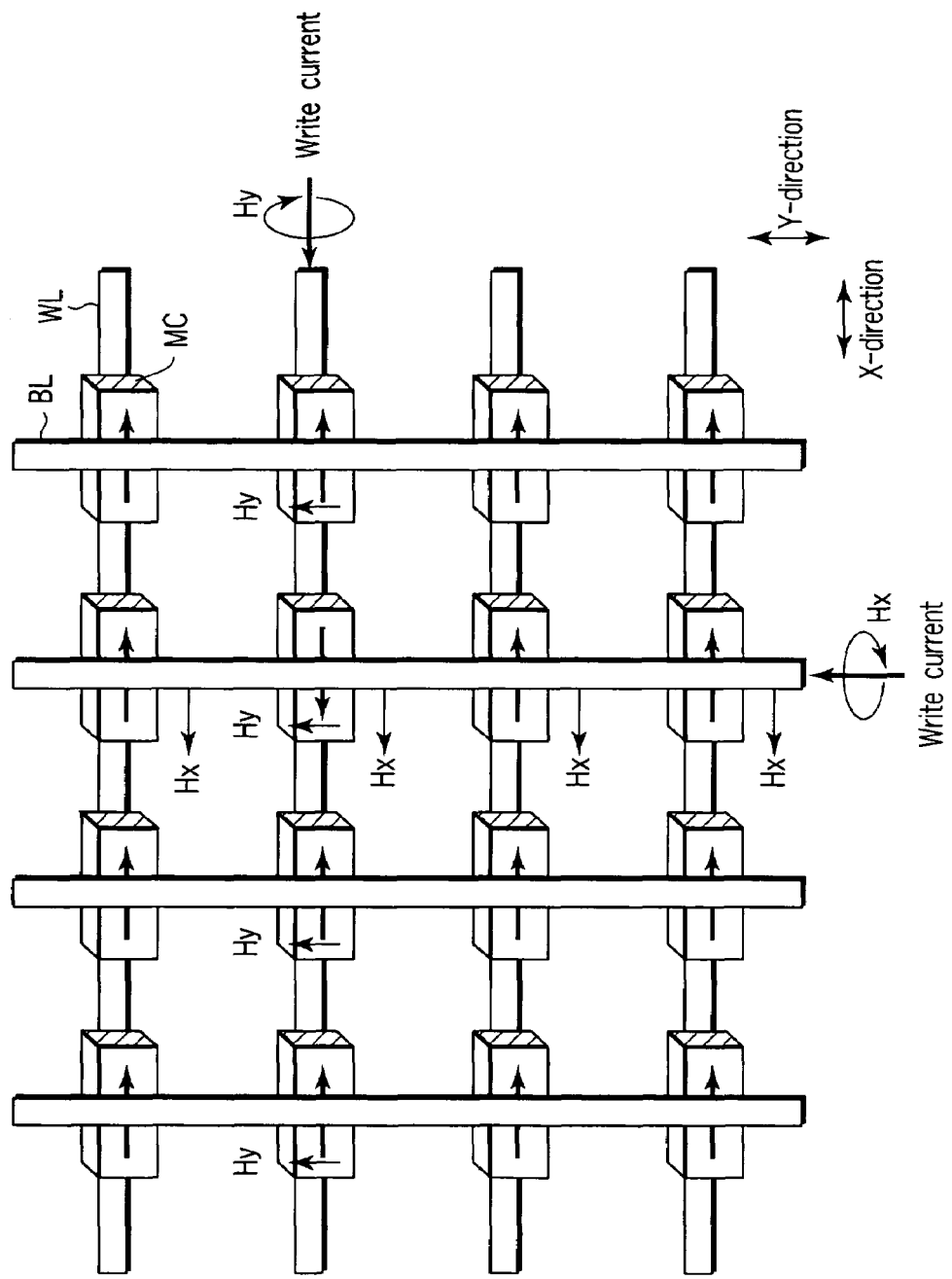
F I G. 7

To first MRAM data update control unit

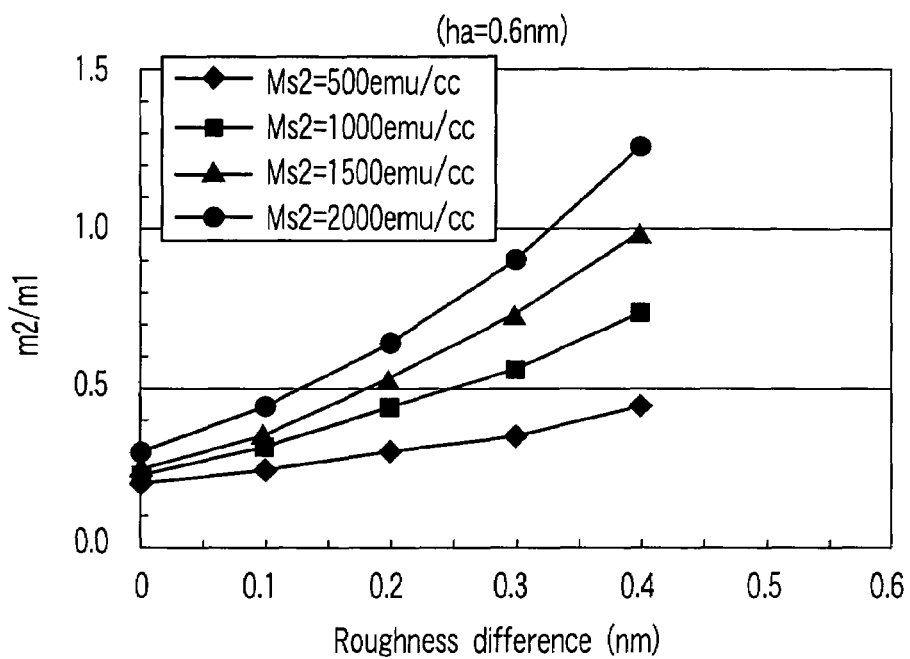
F I G. 21
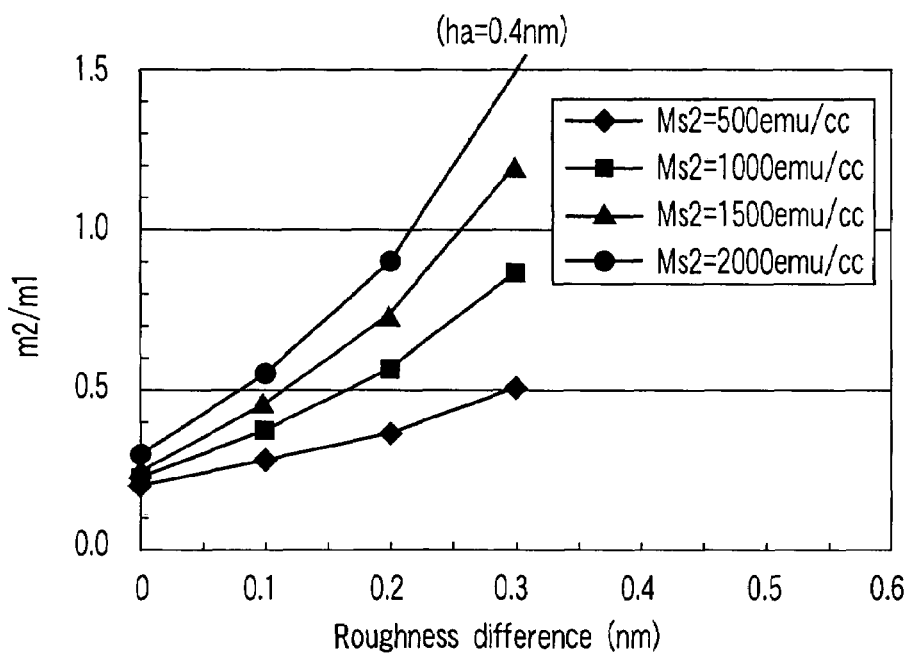
F I G. 22

MAGNETORESISTIVE EFFECT DEVICE, MAGNETIC RANDOM ACCESS MEMORY, AND MAGNETORESISTIVE EFFECT DEVICE MANUFACTURING METHOD

CROSS-REFERENCE TO RELATED APPLICATIONS

This application is based upon and claims the benefit of priority from prior Japanese Patent Application No. 2004-319604, filed Nov. 2, 2004, the entire contents of which are incorporated herein by reference.

BACKGROUND OF THE INVENTION

1. Field of the Invention

The present invention relates to a magnetoresistive effect device, a magnetic random access memory (MRAM), and a magnetoresistive effect device manufacturing method, and particularly to a structure of a magnetic memory cell configured to utilize an device in which storage of information of "1" or "0" is performed by the tunneling magnetoresistive effect.

2. Description of the Related Art

Recently many memories in which the information is stored by a new principle are proposed. One of the newly proposed memories is an MRAM in which magnetic memory cells are arranged in a matrix shape. The magnetic memory cell is formed by a ferromagnetic tunnel junction (MTJ) device in which the storage of information of "1" or "0" is performed by utilizing the tunneling magnetoresistive effect (see Roy Scheuerlein et al., "A 10 ns Read and Write Non-Volatile Memory Array Using a Magnetic Tunnel Junction and FET Switch in each Cell", ISSCCC 2000 Technical Digest pp. 128 to pp. 129). An MRAM has the features of a nonvolatile property and high speed.

The MTJ device includes a barrier layer and two magnetic layers. A magnetization direction of one of the magnetic layers is typically fixed by an antiferromagnetic layer. In the other magnetic layer, the magnetization direction can be changed by an external magnetic field. The magnetic layer whose magnetization direction is variable is referred to as, e.g., recording layer, and the magnetic layer whose magnetization direction is fixed is referred to as, e.g., fixed layer.

Magnetization switching of the magnetic layer is shifted (changed) according to a leakage magnetic field from other magnetic layers, surface roughness, and the like. That is, a hysteresis loop of a magnetization curve of a magnetic body is shifted from an original position. The hysteresis loop is expressed by the magnetic filed (H) and the magnetization (M). Conventionally, the shift caused by the leakage magnetic field from the fixed layer and the shift caused by roughness of a laminated structure exist simultaneously in the magnetization switching shift of the recording layer, so that a switching magnetic field fluctuation is remarkably large among the devices it is preferable that magnitude of the magnetization switching shift of the recording layer is 1 Oe or less, and it is more preferable that the magnetization switching shift is substantially eliminated. Since it is naturally difficult to eliminate the roughness, the recording-layer magnetization switching shift caused by the leakage magnetic field from the fixed layer and the magnetization switching shift caused by the roughness cannot substantially be eliminated at the same time. Therefore, conventionally the thickness of the fixed layer is adjusted to substantially eliminate the magnetization switching shift such that the shift caused by the roughness and the shift caused by the leakage magnetic field cancel each other. However, in this adjustment method, the magnetization switching and the shift of the recording layer are fluctuated because a thickness may vary and a processing may be fluctuated.

Jpn. Pat. Appln. KOKAI Publication No. 2004-128237 discloses a techniques in which the saturation magnetization of a first ferromagnetic layer $23c$ is set smaller than the saturation magnetization of a second ferromagnetic layer $23a$ based on "Effect of finite magnetic film thickness on Neel coupling in spin valves", J. C. S. Kools et al., J. Appl. Phys. 85 (1999) p. 4466–68. That is, in Jpn. Pat. Appln. KOKAI Publication No. 2004-128237, a difference in magnetic moment per unit area between the first ferromagnetic layer and the second ferromagnetic layer is increased to substantially eliminate only the recording-layer magnetization switching shift caused by the roughness. However, since the difference in magnetic moment per unit area between the first ferromagnetic layer and the second ferromagnetic layer is large, the shift caused by the leakage magnetic field does not become substantially zero. Further, in the case where the thickness difference is large, a large distance may be provided between the end of the fixed layer and the recording layer to relatively decrease the shift caused by the leakage magnetic field. However, this technique is not suitable for miniaturization and may not be realistic.

BRIEF SUMMARY OF THE INVENTION

According to a first aspect of the present invention, there is provided a magnetoresistive effect device comprising: a first ferromagnetic layer having a fixed magnetization direction and having magnetic moment m1 per unit area; a nonmagnetic layer contacting with the first ferromagnetic layer, having an amplitude hi of roughness of an interface between the nonmagnetic layer and the first ferromagnetic layer; a second ferromagnetic layer contacting with the nonmagnetic layer on an opposite side to the first ferromagnetic layer, having a fixed magnetization direction, having magnetic moment m2 per unit area which is smaller than the magnetic moment m1, and having an amplitude h2 of roughness of an interface between the second ferromagnetic layer and the nonmagnetic layer; a barrier layer contacting with the second ferromagnetic layer on an opposite side to the nonmagnetic layer, and having an amplitude h3 of roughness of an interface between the barrier layer and the second ferromagnetic layer, the amplitude h3 being smaller than the amplitudes h1 and h2; and a third ferromagnetic layer contacting with the barrier layer on an opposite side to the second ferromagnetic layer and having a variable magnetization direction.

According to a second aspect of the present invention, there is provided a magnetic random access memory comprising: a magnetoresistive effect device which comprises a first ferromagnetic layer having a fixed magnetization direction and having magnetic moment m1 per unit area, a nonmagnetic layer contacting with the first ferromagnetic layer and having an amplitude h1 of roughness of an interface between the nonmagnetic layer and the first ferromagnetic layer, a second ferromagnetic layer contacting with the nonmagnetic layer on an opposite side to the first ferromagnetic layer, having a fixed magnetization direction, having magnetic moment m2 per unit area which is smaller than the magnetic moment m1, and having an amplitude h2 of roughness of an interface between the second ferromagnetic layer and the nonmagnetic layer, a barrier layer contacting with the second ferromagnetic layer on an opposite side to the nonmagnetic layer and having an amplitude h3 of roughness of an interface between the barrier layer and the second ferromagnetic layer, the amplitude h3 being smaller than the amplitudes h1 and h2, and a third ferromagnetic layer contacting with the barrier layer on an opposite side to the second ferromagnetic layer and having a variable magnetization direction; a first wiring electrically connected to the first ferromagnetic layer or the third ferromagnetic layer; and a second wiring sandwiching the magnetoresistive effect device with the first wiring.

According to a third aspect of the present invention, there is provided a magnetoresistive effect device manufacturing method comprising: forming a first ferromagnetic layer having a fixed magnetization direction and having magnetic moment m1 per unit area; forming a nonmagnetic layer on the first ferromagnetic layer; forming a second ferromagnetic layer on the nonmagnetic layer, the second ferromagnetic layer having a fixed magnetization direction and having magnetic moment m2 per unit area which is smaller than the magnetic moment m1; smoothing a surface of the second ferromagnetic layer on an opposite side to the nonmagnetic layer; forming a barrier layer on the second ferromagnetic layer; and forming a third ferromagnetic layer on the barrier layer, the third ferromagnetic layer having a variable magnetization direction.

BRIEF DESCRIPTION OF THE SEVERAL VIEWS OF THE DRAWING

FIG. 7 schematically shows an example of a plane layout of an MRAM cell array;

FIGS. 20, 21, 22, 23 and 24 show a relationship between a ratio m2/m1 of a first ferromagnetic magnetic thickness to a second ferromagnetic magnetic thickness and a roughness difference.

DETAILED DESCRIPTION OF THE INVENTION

Figure 1A:
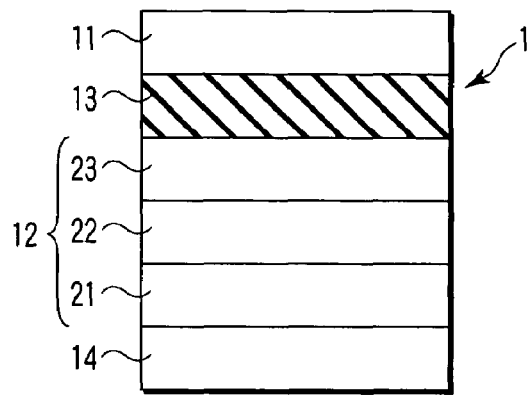
FIGS. 1A, 1B and 1C schematically show an MTJ device of a magnetic random access memory according to an embodiment of the invention.

Preferred embodiments of the invention will be described below with reference to the drawings. In the following descriptions, a component having substantially the same function and configuration is designated by the same reference numeral, and the overlap description will be given only if needed.

(1) Embodiment

FIG. 1A is a schematic view showing an MTJ device of a magnetic random access memory according to an embodiment of the invention. As shown in FIG. 1A, an MTJ device 1 has a laminated structure. In the laminated structure, a tunnel barrier layer 13 is sandwiched between a magnetic recording layer (free layer) 11 and a fixed layer (fixed magnetic layer, fixing layer, or pin layer) 12. This structure enables to obtain the TMR effect.

The fixed layer 12 is formed in the so-called synthetic structure. In other words, a first ferromagnetic layer 21 and a second ferromagnetic layer 23 are coupled in an antiferromagnetic manner (antiferromagnetically coupled) through a nonmagnetic layer 22. The tunnel barrier layer 13 is located on the second ferromagnetic layer 23. An antiferromagnetic layer 14 is provided beneath the fixed layer 12 and fixes the magnetization direction of the fixed layer 12.

Figure 1B:
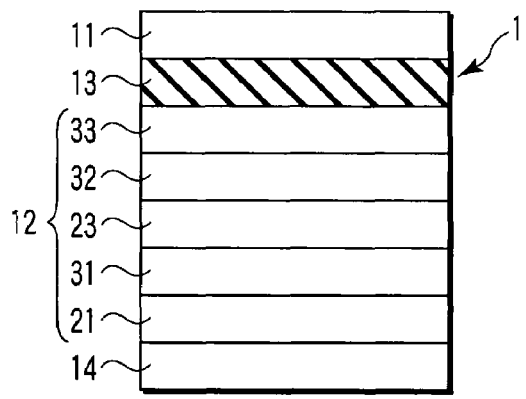
Figure 1C:
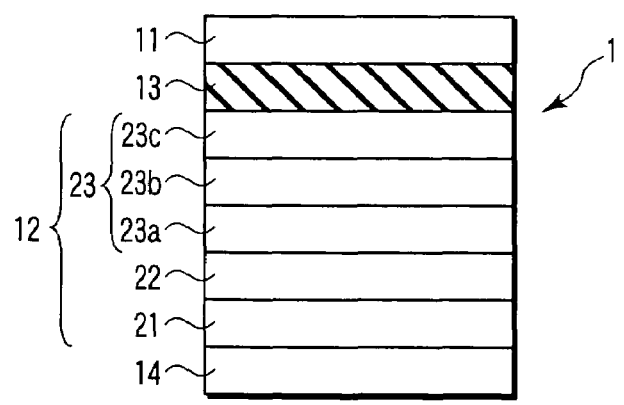

Conversely, a mechanism for fixing the magnetization direction is not provided for the recording layer (third ferromagnetic layer) 11, and the magnetization direction is freely changed. The structure of the MTJ device 1 is not limited to the structure shown in FIG. 1. For example, as shown in FIG. 1B, the fixed layer 12 may have the structure in which the first ferromagnetic layer 21, a first nonmagnetic layer 31, the second ferromagnetic layer 23, a second nonmagnetic layer 32, and a third ferromagnetic layer 33 are sequentially laminated. For example, as shown in FIG. 1C, the second ferromagnetic layer 23 may be formed by layers 23a to 23c.

An alloy containing at least one element of Co, Fe, and Ni can be used as materials of the first ferromagnetic layer 21 and the second ferromagnetic layer 23. The saturation magnetization of Co, Fe, Ni and the alloy thereof can be known by a Slater-Pauling curve. These layers can also be made of amorphous materials and microcrystalline materials. In this case, these layers can be formed by adding B, C, N, Si, Ta, Zr, Nb and the like to the alloy containing at least one element of Co, Fe, and Ni. Further, at least two magnetic layers made of these materials may be laminated. In this case, the laminated magnetic layers are coupled in a ferromagnetic manner (ferromagnetically coupled), and the magnetization directions are orientated toward substantially the same direction.

Ru, Rh, Re, Os, Ir, V, Cr, Cu, Nb, Mo, Ta, W, and an alloy containing at least one element thereof can be used as the material of the nonmagnetic layer 22.

An alloy containing Mn and at least one of Pt, Ir, Pd, Rh, Ru, Cr can be used as the material of the antiferromagnetic layer 14. The antiferromagnetic layer 14 can be used while a surface orientation of the antiferromagnetic layer 14 is orientated toward (111). In this case, the material having an FCC structure whose lattice constant is about 4A and the material having a BCC structure whose lattice constant is about 2.8A, e.g., Pt, Rh, Pd, Ir, Cu, and Al can be used as a ground. Ru, NiFe, NiCr, NiFeCr, and the like may be used.

Al—O, Mg—O, Si—O, Al—N, Si—N, Ce—O, Hf—O, and a mixture thereof can be used as the material of the tunnel barrier layer 13. In addition, any material exhibiting the tunneling magnetoresistive effect can be used.

Figure 2:
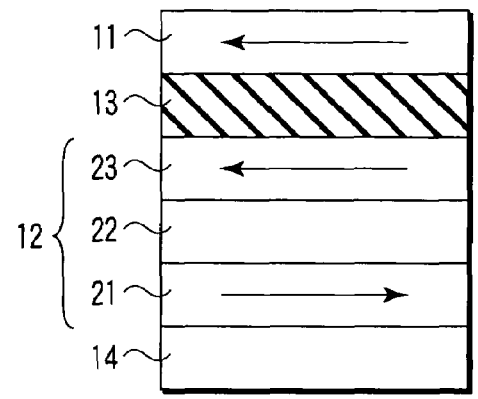
FIGS. 2 and 3 schematically shows a state of magnetization directions of a fixed layer and a recording layer.
Figure 3:
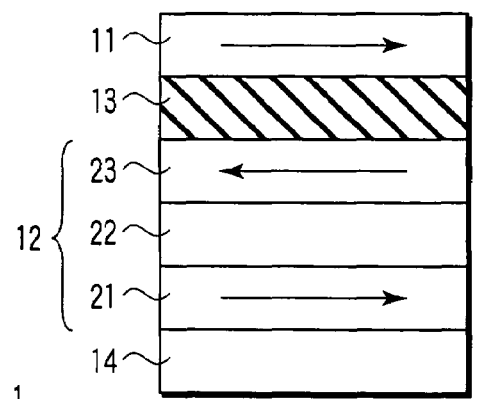

FIGS. 2 and 3 schematically show two states of the magnetization directions of the fixed layer 12 and the recording layer 11. As shown in FIG. 2, when the magnetization directions (orientations of arrows in the drawing) of the fixed layer 12 and the recording layer 11 are parallel (same), tunnel resistance of the tunnel barrier layer 13 is the lowest (tunnel current is the maximum). On the other hand, as shown in FIG. 3, when the magnetization directions of the fixed layer 12 and the recording layer 11 are antiparallel (different), the tunnel resistance of the tunnel barrier layer 13 is the highest (tunnel current is the minimum). The MTJ device 1 can store binary information by causing these two states to correspond to, e.g., the storage state of information of "1" ("1" state) and the storage state of information of "0" ("0" state), respectively.

Then, a condition that the switching magnetic field shift of the recording layer 11 is brought close to zero will be described. As described above, usually the recording-layer magnetization switching shift caused by the interface roughness and the shift caused by the leakage magnetic field of the fixed layer cancel each other by adjusting the magnetic thickness of the fixed layer. Thus, the recording-layer magnetization switching shift is adjusted to substantially zero. However, the leakage magnetic field from the fixed layer changes depending on the size and the thickness of the MTJ device, the recording-layer magnetization switching shift is sensitive to a processing fluctuation and a thickness fluctuation, which results in the fluctuation in the switching magnetic field. Therefore, it is desirable that the shift caused by the interface roughness is substantially eliminated while the magnetic thickness of the fixed layer is set such that the leakage magnetic field is substantially eliminated.

In the case of the synthetic pin structure, the recording-layer switching magnetic field shift caused by the leakage magnetic field can substantially be eliminated by satisfying the following condition. That is, it is necessary that a ratio (m2/m1) of the magnetic thickness (magnetic moment per unit area) m1 of the first ferromagnetic layer 21 to the magnetic thickness m2 of the second ferromagnetic layer 23 is set to 0.5 or more. It is preferable that the ratio is adjusted in the range of 0.8 to 1.0.

The switching magnetic field shift caused by the leakage magnetic field also depends on a MTJ device processing method. In the synthetic pin structure, the influence of the processing method can remarkably be decreased by appropriately adjusting the thicknesses of the first ferromagnetic layer 21 and the second ferromagnetic layer 23. That is, in processing the MTJ device 1, the influence of the processing method may be decreased by adjusting the thickness such that the leakage magnetic field generated from the first ferromagnetic layer 21 and the second ferromagnetic layer 23 is substantially eliminated at a position of the recording layer 11.

Figure 18:
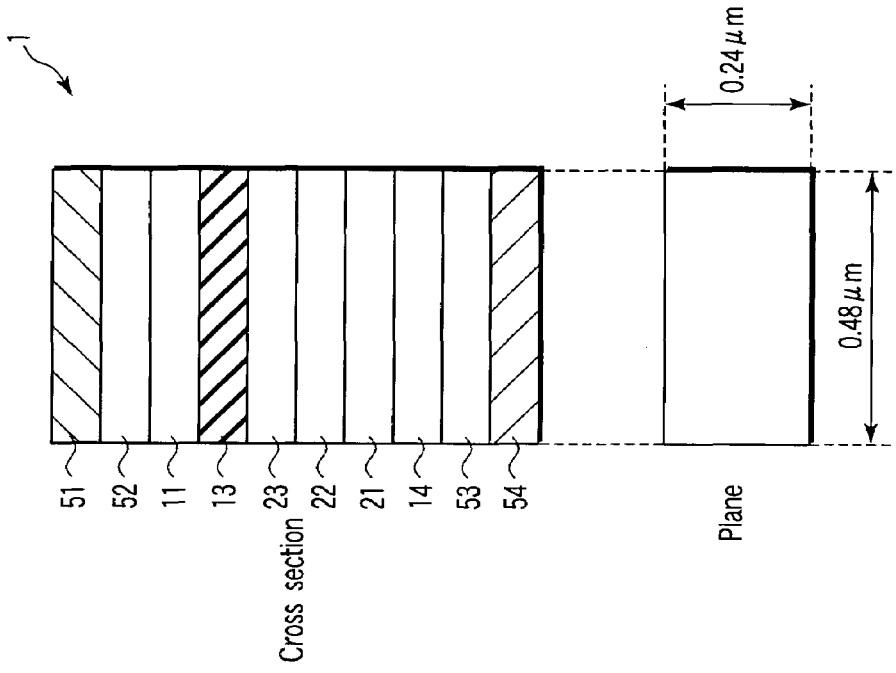
FIGS. 17 and 18 show a processing example of the MTJ device.
Figure 17:
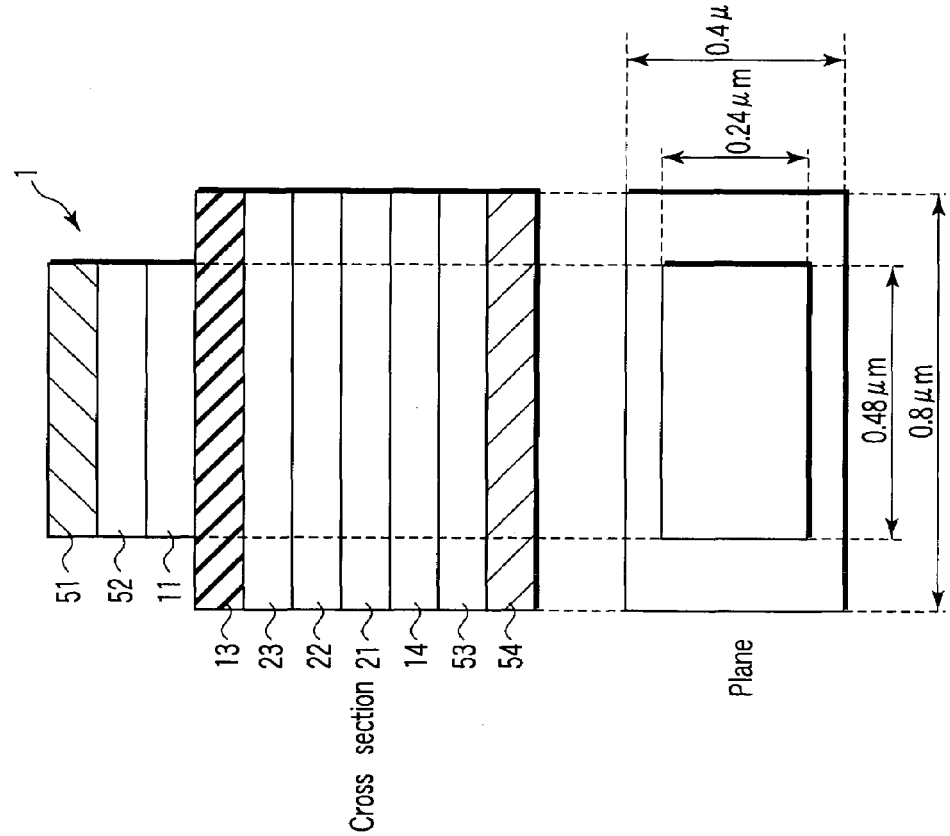

As shown in FIGS. 17 and 18, examples of the method of processing the MTJ device 1 includes a two-stage etching method in which the recording layer 11 differs from the fixed layer in the size (FIG. 17) and a one-stage etching method in which the sizes of the recording layer 11 and the fixed layer are equal to each other (FIG. 18). Thus the thicknesses of the first ferromagnetic layer 21 and the second ferromagnetic layer 23 constituting the fixed layer 12 are adjusted, then thicknesses which allow the shift caused by the leakage magnetic field from the fixed layer 12 to be substantially eliminated exists even if the processing methods are completely different from each other. FIGS. 17 and 18 show the state in which a cap layer 52 and an upper electrode 51 are provided on the recording layer 11 in the structure of FIG. 1A and a ground layer 53 and a lower electrode 54 are provided beneath the antiferromagnetic layer 14.

An LLG simulation was performed on the MTJ device 1 which has the shapes shown in FIGS. 17 and 18. The thickness, the saturation magnetization, and anisotropy energy density of the recording layer 11 were set to 3 nm, 850 emu/cc, and $1 \times 10^3$ erg/cc respectively. The thickness, the saturation magnetization, and the anisotropy energy density of the first ferromagnetic layer 21 were set to 1.5 nm, 1400 emu/cc, and $8 \times 10^4$ erg/cc respectively. Uni-directional anisotropy was given such that an exchange coupling magnetic field between the first ferromagnetic layer 21 and the antiferromagnetic layer 14 becomes 750 Oe. The saturation magnetization and the anisotropy energy density of the second ferromagnetic layer 23 were set to 1400 emu/cc and $1 \times 10^4$ erg/cc. The thickness of the nonmagnetic layer 22 is set at 1 nm, and interlayer antiferromagnetic coupling energy density was set to 0.7 erg/cm$^2$. The thickness of the barrier layer 13 is set at 1 nm.

When a magnetization switching process of the recording layer 11 is computed under the above conditions, the magnetization switching shift was observed in the recording layer 11. In the computation, because each interface is assumed to be flat, the magnetization switching shift of the recording layer 11 caused by the roughness does not emerge. Therefore, the shift observed in the simulation is the magnetization switching shift of the recording layer 11 caused by the leakage magnetic field.

Figure 19:
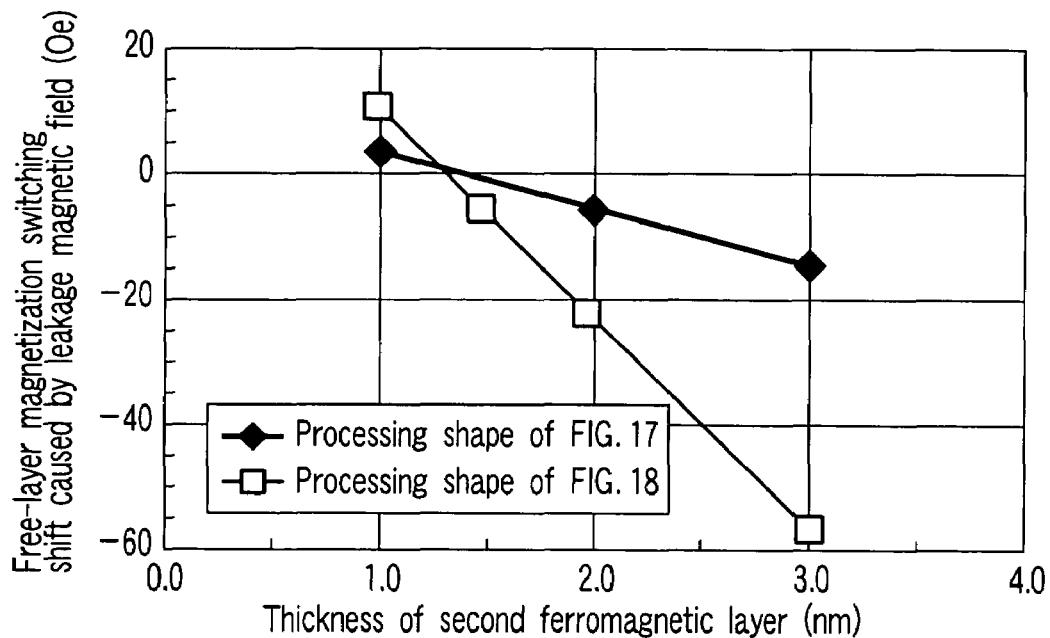
FIG. 19 shows a relationship between the second ferromagnetic layer thickness and a free-layer magnetization switching shift amount caused by a leakage magnetic field.

When the computation was performed while the thickness of the second ferromagnetic layer 23 was changed, the results shown in FIG. 19 were obtained for the processing shapes shown in FIGS. 17 and 18. As can be seen from FIG. 19, it can be estimated that the thicknesses of the second ferromagnetic layer 23 in which the magnetization switching shift of the recording layer 11 caused by the leakage magnetic field becomes zero are 1.35 nm and 1.4 nm for the processing shapes shown in FIGS. 17 and 18 respectively, and it is seen that the thicknesses are substantially similar regardless of the processing shape. At this point, the ratio m2/m1 of the magnetic thicknesses (product of saturation magnetization and thickness) m1 and m2 of the first ferromagnetic layer 21 and the second ferromagnetic layer 23 are 0.9 and 0.93 for the processing shapes shown in FIGS. 17 and 18 respectively. In the actual processing of the MTJ device, a cross-sectional shape of the device has a taper, thickness varies among the MTJ devices, and the like. Therefore, the ratio m2/m1 is preferred to be 0.8 or more and lower than 1.0. In consideration of the fluctuation in cell on the production, the ratio m2/m1 is preferably 0.98 or less, more preferably 0.95 or less.

With reference to the shift caused by the interface roughness, an analytic expression is reported in "Effect of finite magnetic film thickness on Neel coupling in spin valves", J. C. S. Kools et al., J. Appl. Phys. 85 (1999) pp. 4466–68. The inventors expand the analytic expression to the synthetic pin structure and consider the unique problem of the MRAM that the switching magnetic field fluctuates, which leads to the invention.

In the synthetic pin structure, there is the following relationship between the interface roughness and the direction and magnitude in which the recording-layer switching magnetic field is shifted. That is, the interface between the tunnel barrier layer 13 and the second ferromagnetic layer 23 and the interface between the first ferromagnetic layer 21 and the antiferromagnetic layer 14 shift the switching magnetic field of the recording layer 11 toward the opposite direction to the interface between the second ferromagnetic layer 23 and the nonmagnetic layer 22 and the interface between the first ferromagnetic layer 21 and the nonmagnetic layer 22. More particularly, the smaller the roughness of the interface between the tunnel barrier layer 13 and the second ferromagnetic layer 23 and the interface between the first ferromagnetic layer 21 and the antiferromagnetic layer 14 is, the smaller the magnitude of the switching magnetic field shift of the recording layer 11 is. On the other hand, the larger the roughness of the interface between the second ferromagnetic layer 23 and the nonmagnetic layer 22 and the interface between the first ferromagnetic layer 21 and the nonmagnetic layer 22 is, the smaller the magnitude of the switching magnetic field shift of the recording layer 11 is.

The interface closer to the recording layer 11 has the larger influence on the switching magnetic field shift of the recording layer 11. Since the interface between the first ferromagnetic layer 21 and the antiferromagnetic layer 14 is separated farther away from the recording layer 11, compared with other interfaces, the interface between the first ferromagnetic layer 21 and the antiferromagnetic layer 14 has the least contribution to the switching magnetic field shift of the recording layer 11. Even if the interface between the first ferromagnetic layer 21 and the antiferromagnetic layer 14 is changed in the realistic range, e.g., in the range of 0.1 to 1 nm, the shift caused by the interface roughness and the shift caused by the leakage magnetic field can substantially be eliminated at the same time by adjusting other interface roughnesses as described above in the recording layer 11.

Since the antiferromagnetic layer 14 improves pin characteristics, it is desirable to perform crystal growth to form it. In this case, the roughness increases as a crystal grain is grown. Therefore, smoothness in the interface between the first ferromagnetic layer 21 and the antiferromagnetic layer 14 is usually not so good.

Thus, it is preferable that the interface closer to the tunnel barrier layer 13, i.e., the interface between the tunnel barrier layer 13 and the second ferromagnetic layer 23 is formed smoother than the interface between the second ferromagnetic layer 23 and the nonmagnetic layer 22 and the interface between the first ferromagnetic layer 21 and the nonmagnetic layer 22. Conventionally, the interface roughnesses are similar to one another, or the interface roughness of the upper layer is larger than that of the lower layer. On the contrary, in the embodiment, each interface roughness is artificially adjusted to perform the separate adjustment such that the contribution of each interface to the shift of the recording layer 11 is cancelled as a whole. At the same time, it is preferable that the ratio m2/m1 of the magnetic thickness m1 of the first ferromagnetic layer 21 and the magnetic thickness m2 of the second ferromagnetic layer 23 is 0.5 or more.

Figure 4:
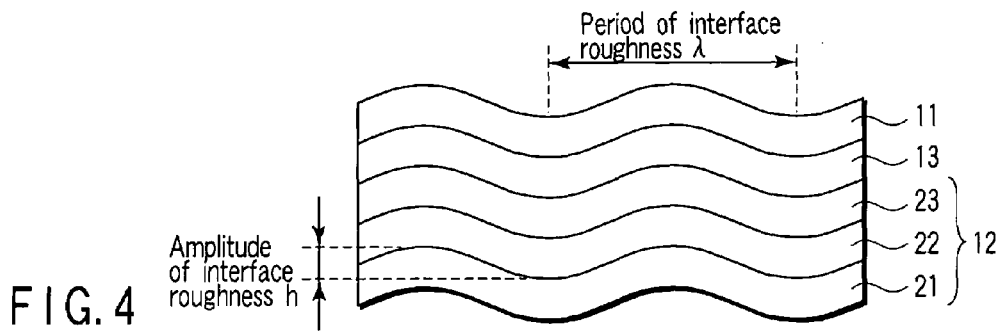
FIG. 4 explains a definition of interface roughness.

Amplitude of the interface roughness h and a period $\lambda$ are defined as shown in FIG. 4. That is, the amplitude h is defined by a difference in height between the most swelled portion and the most depressed portion when the surfaces of the layers vibrates with the substantially constant amplitude. The period $\lambda$ is a distance between the maximum (minimum) amplitude positions.

Figure 5:
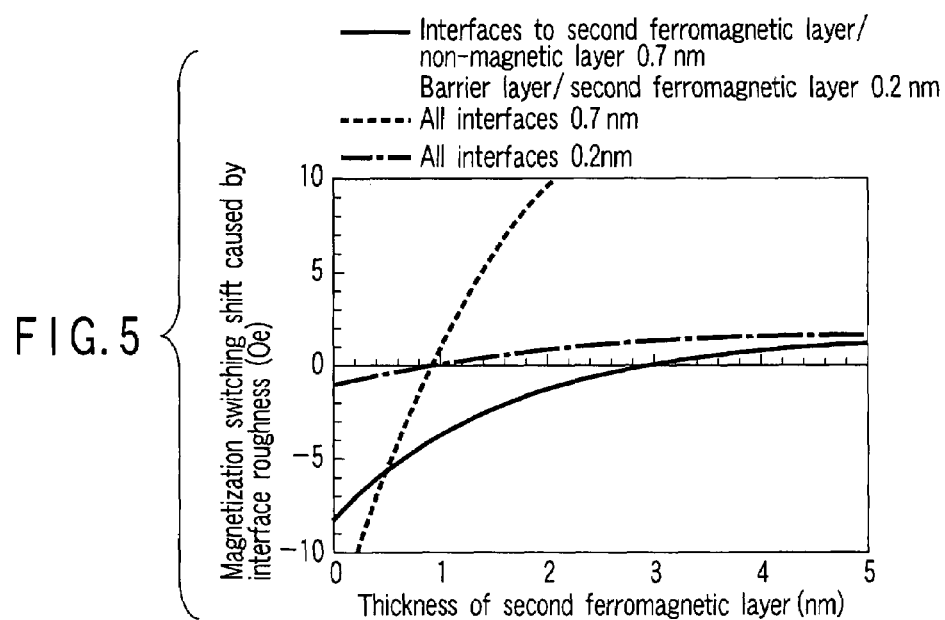
FIG. 5 is shows a simulation result in various interface roughnesses of dependence of recording layer magnetization switching shift caused by the interface roughness on a second ferromagnetic layer thickness according to the embodiment of the invention.

Then, the method of bringing the switching magnetic field shift of the recording layer 11 caused by the interface roughness of each layer in the MTJ device 1 close to zero will be described more specifically. FIG. 5 shows simulation results in various surface roughnesses of dependence of the recording layer magnetization switching shift caused by the interface roughness on the second ferromagnetic layer thickness according to the embodiment of the invention. The simulation was carried out under the following characteristics. The thickness of the first ferromagnetic layer 21 is 2.5 nm, the thickness of the nonmagnetic layer 22 is 0.9 nm, the saturation magnetization of the first ferromagnetic layer 21 is 1500 emu/cc, and the saturation magnetization of the second ferromagnetic layer 23 is 1000 emu/cc. The thickness of the recording layer 11 is 5 nm, and the saturation magnetization of the recording layer 11 is 800 emu/cc. The thickness of the tunnel barrier layer 13 is 1.3 nm. The period of the interface roughness is 15 nm.

In the sample having the above characteristics, the results are shown when the amplitude of the interface roughness of each layer in the MTJ device 1 is constant at 0.2 nm or 0.7 nm with an alternate long and short dash line and a broken line respectively. The thickness of the second ferromagnetic layer 23, which allows the switching magnetic field shift of the recording layer 11 caused by the interface roughness to be substantially eliminated, is about 0.9 nm as shown in FIG. 5. However, in this case, the ratio m2/m1 of the magnetic thickness m1 of the first ferromagnetic layer 21 and the magnetic thickness m2 of the second ferromagnetic layer 23 is not 0.5 or more. Therefore, the switching magnetic field shift of the recording layer 11 caused by the leakage magnetic field from the fixed layer 12 is not substantially eliminated.

The inventors set the amplitudes of the roughness of the interfaces included in the interface between antiferromagnetic layer 14 and the first ferromagnetic layer 21 and the interface between the nonmagnetic layer 22 and the second ferromagnetic layer 23 at the values different from the amplitude of the roughness of the interface between the second ferromagnetic layer 23 and the tunnel barrier layer 13. The solid line shows the result. This results were obtained when the amplitude of the interface roughness between the second ferromagnetic layer 23 and the tunnel barrier layer 13 was set at 0.2 nm, and the amplitudes of the roughness of the interfaces included in the interface between the antiferromagnetic layer 14 and the first ferromagnetic layer 21 and the interface between the nonmagnetic layer 22 and the second ferromagnetic layer 23 were set at 0.7 nm. As shown in FIG. 5, the thickness of the second ferromagnetic layer 23 in which the switching magnetic field shift of the recording layer 11 caused by the interface roughness is substantially eliminated is about 3 nm. With that value, the ratio m2/m1 of the magnetic thickness m1 of the first ferromagnetic layer 21 and the magnetic thickness m2 of the second ferromagnetic layer 23 is about 0.86, which satisfies the condition of 0.5 or more. Therefore, both the switching magnetic field shift of the recording layer 11 caused by the interface roughness and the shift caused by the leakage magnetic field from the fixed layer 12 can substantially be eliminated.

Figure 6:
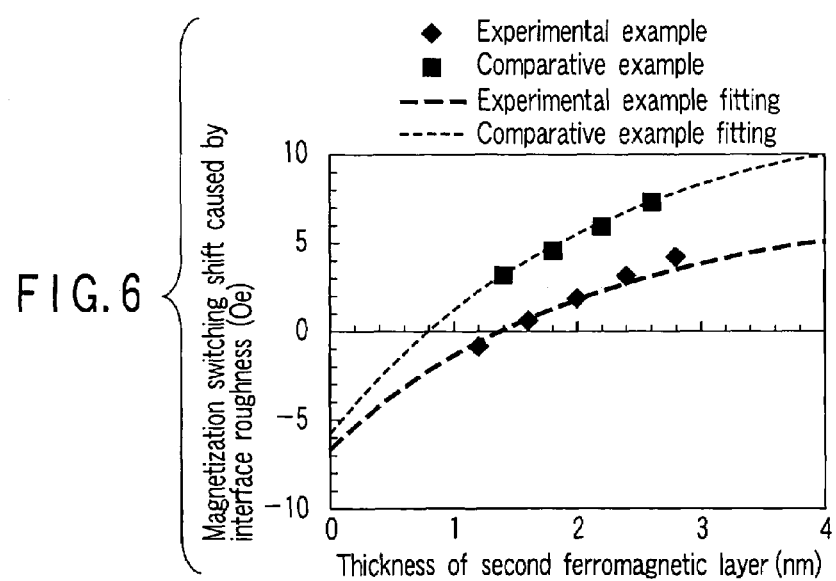
FIG. 6 shows an experimental result of the dependence of the recording layer magnetization switching shift caused by the interface roughness on the second ferromagnetic layer thickness according to the embodiment of the invention.

FIG. 6 shows an experimental result of the dependence of the recording layer magnetization switching shift caused by the interface roughness on the second ferromagnetic layer thickness according to the embodiment of the invention. In obtaining the relationship shown in FIG. 6, data measured by using the following sample is plotted. In the sample of the MTJ device, a PtMn film having the thickness of 15 nm is provided as the antiferromagnetic layer on a Ta film having the thickness of 50 nm as a seed layer. A CoFe film having the thickness of 2.4 nm as the first ferromagnetic layer and a Ru film having the thickness of 0.8 nm as the nonmagnetic layer are provided on the antiferromagnetic layer. The second ferromagnetic layer, an Al—O film having the thickness of 1.5 nm as the tunnel barrier layer, a NiFe film having the thickness of 4 nm as the recording layer, and the Ru film having the thickness of 1 nm as the cap layer are sequentially provided on the nonmagnetic layer.

In the experimental example, after the second ferromagnetic layer is formed, a smoothing treatment is performed by reverse sputtering. In the comparative example, all the layers are formed without performing the smoothing treatment. That is, in the experimental result, it is expected that the interface between the second ferromagnetic layer and the tunnel barrier layer is smoother than the interface between the nonmagnetic layer and the second ferromagnetic layer. When the surface roughness of the second ferromagnetic layer was measured with an atomic force microscope (AFM), average roughnesses of the comparative example and the experimental example are 0.35 nm and 0.22 nm, respectively.

Then, fitting of the values obtained by the above experiment is performed. The broken line in FIG. 6 shows the fitting of the pieces of measurement data of the experimental example and the comparative example. In the fitting, the above setting values were used for the thickness of the layers except that the thickness of the recording layer is set at 3.7 nm. The saturation magnetization of the recording layer is set at 740 emu/cc. In the saturation magnetization of the fixed layer, both the first ferromagnetic layer and the second ferromagnetic layer are set at 1400 emu/cc. The roughness period is set at 18 nm. In the experimental example, the amplitudes of the roughness of interfaces located from the interface between antiferromagnetic layer and the first ferromagnetic layer to the interface between the nonmagnetic layer and the second ferromagnetic layer were set at 0.52 nm, and the amplitude of the roughness of the interface between the second ferromagnetic layer and the tunnel barrier layer was set at 0.39 nm. On the other hand, in the comparative example, all the amplitudes of the interface roughness were set at 0.52 nm.

That the amplitude of the interface roughness used in the fitting coincides substantially with the actually measured average roughness will be described below. An average roughness Ra measured with the atomic force microscope is expressed as follows.

$$Ra = \left(\sum_{i=1}^{n} |Z_i - Z_{cp}|\right) / N = 2h/\pi$$

Where $Z_i$ is measuring point of the roughness, $Z_{cp}$ is a reference value of the roughness in all the measuring points, N is the number of measuring points, and h is the amplitude of the roughness. Assuming that Z of the roughness is periodic, $Z = h \times \sin(2\pi x/\lambda)$ is obtained. Where $\lambda$ is the period of the amplitude, and x is the distance (coordinate) in a plane direction (arbitrary direction) on the measuring surface.

As described above, the surface average roughnesses Ra measured in the experimental example and the comparative example are 0.22 nm and 0.35 nm, respectively. When the amplitudes of the surface roughness are substituted for the surface average roughness Ra, 0.35 nm and 0.55 nm are obtained. These values are substantially equal to the conditions of 0.39 nm and 0.55 nm which are used in the fitting. That is, it can be said that the result obtained by the fitting is correctly reflected on the measurement data.

Note that the amplitude of the roughness can be analyzed by a sectional TEM image of the MTJ device. In this case, the period and the amplitude can be determined by the fitting of each interface using a periodic function.

As can be seen from FIG. 6, the thickness of the second ferromagnetic layer in which the magnetization switching shift caused by the roughness is substantially eliminated is 1.4 nm in the experimental example and 0.8 nm in the comparative example. Similarly to the computation results shown in FIG. 4, these results show that the shift caused by the roughness can substantially be eliminated by controlling the interface roughness while the magnetization switching shift caused by the leakage magnetic field is substantially kept zero.

FIGS. 20 to 24 are views showing the relationship between the roughness difference and the ratio m2/m1 of the first ferromagnetic magnetic thickness to the second ferromagnetic magnetic thickness. The relationship between the ratio m2/m1 and the roughness difference is obtained by the same simulation as FIG. 5. The thickness of the second ferromagnetic layer 23, which allows the switching magnetic field shift of the recording layer 11 caused by the roughness to be eliminated, is computed to estimate the ratio m2/m1 from the magnetic thickness m2. In FIGS. 20 to 23, the thickness of the first ferromagnetic layer 21 is 2.5 nm, saturation magnetization Ms1 of the first ferromagnetic layer 21 is 1500 emu/cc (1000 emu/cc in only FIG. 23), and saturation magnetization Ms2 of the second ferromagnetic layer 23 ranges from 500 to 2000 emu/cc. In the recording layer 11, the thickness is 5 nm, and saturation magnetization 800 emu/cc. The thickness of the barrier layer 13 is 1.3 nm. The period of the interface roughness is 15 nm.

Figure 20:
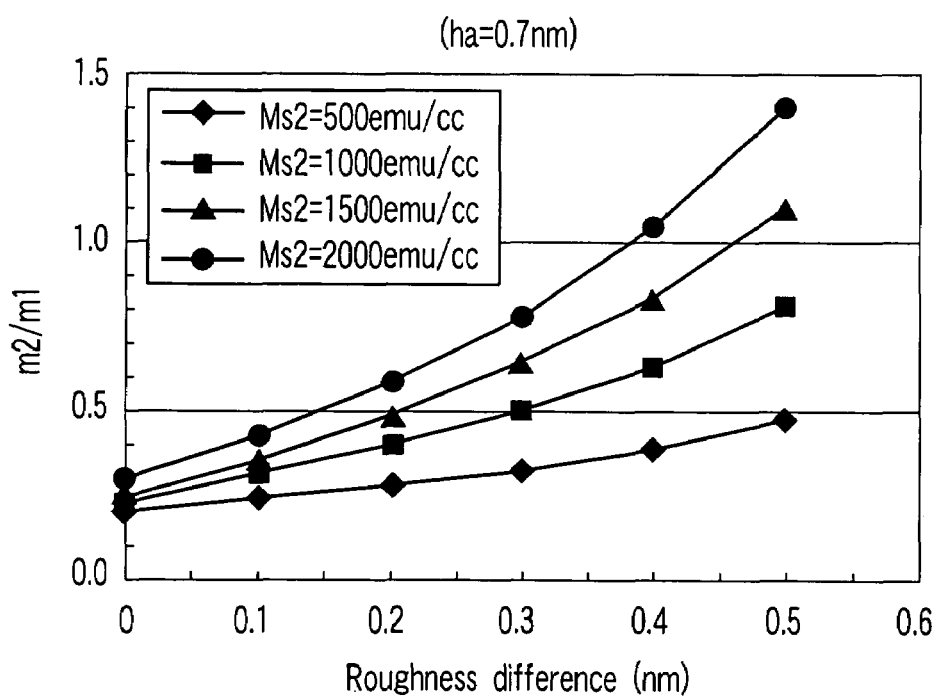

It is assumed that the amplitudes of the interface roughnesses from the interface between the antiferromagnetic layer 14 and the first ferromagnetic layer 21 to the interface between the nonmagnetic layer 22 and the second ferromagnetic layer 23 all are set at ha. It is assumed that the amplitudes of the interface roughnesses from the interface between the second ferromagnetic layer 23 and the tunnel barrier layer 13 to the interface on the upper side of the recording layer 11 (interface between the recording layer 11 and the cap layer 52 of FIGS. 17 and 18) all are set at hb. The roughness difference is expressed by ha–hb. FIG. 20 shows the computation result in the case of ha=0.7 nm. The larger the ratio m2/m1 is, the larger the roughness difference is. When the roughness differences are similar to one another, the larger the ratio m2/m1 is, the larger the saturation magnetization Ms2 of the second ferromagnetic layer 23 is. As can be seen from FIG. 20, when the roughness difference ranges from 0.2 to 0.5 nm, the ratio m2/m1 is 0.5 or more and lower than 0.1 in many cases. In consideration of the fluctuation in cell on the production, preferably the ratio m2/m1 is 0.98 or less, more preferably 0.95 or less.

That is, the ratio m2/m1 is easily set in the range of 0.5 to 1.0 by setting the roughness difference in the range of 0.2 to 0.5 nm.

Figure 23:
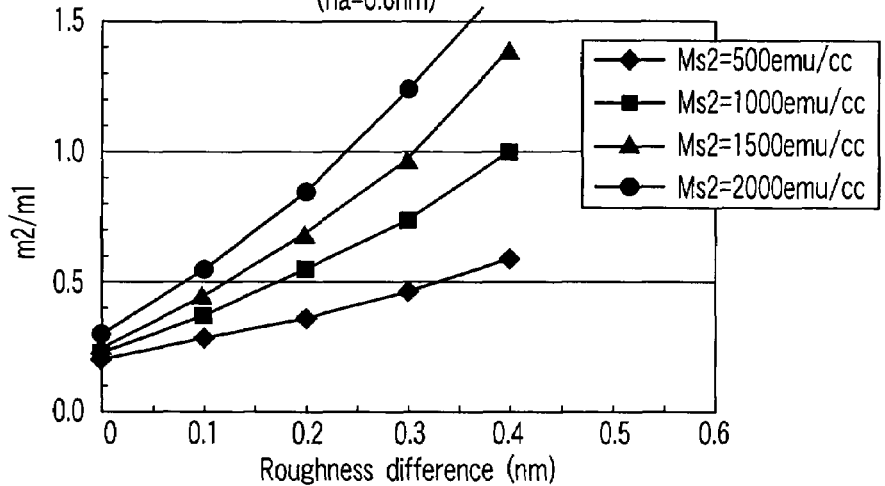

FIGS. 21 and 22 show the computation results with ha set at 0.6 nm and 0.4 nm. The computation results shown in FIGS. 21 and 22 have the same tendency as FIG. 20. FIG. 23 shows the computation result with ha set at 0.6 nm and the saturation magnetization Ms1 of the first ferromagnetic layer 21 set at 1000 emu/cc. It is seen that the ratio m2/m1 tends to be bigger than the ratio of FIG. 21 as long as the roughness difference and the saturation magnetization Ms2 of the second ferromagnetic layer 23 are the same in the both results. This is because the magnetic thickness m1 of the first ferromagnetic layer is small.

Figure 24:
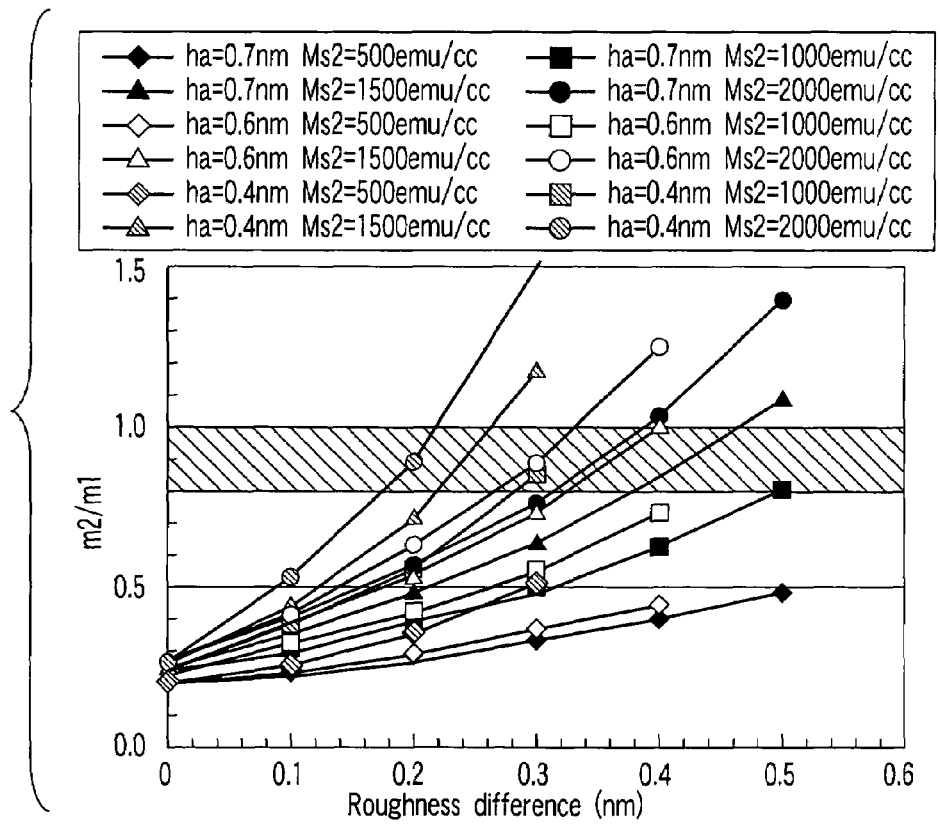

FIG. 24 shows the plotted data of FIGS. 20 to 22 are plotted. FIG. 23 shows that, when the saturation magnetization Ms1 of the first ferromagnetic layer 21 is 1500 emu/cc, the roughness difference of about 0.2 nm to about 0.5 nm and the saturation magnetization Ms2 of the second ferromagnetic layer 23 of about 1000 emu/cc to about 2000 emu/cc can easily realize the condition which can eliminate the magnetization switching shift of the recording layer 11 caused by the roughness and keeps the ratio m2/m1 0.8 or more and lower than 1.0, or 0.98 or less, more preferably 0.95 or less with the cell shape fluctuation on the production taken into account. When the roughness difference is small, it is seen that the magnetic thickness of the second ferromagnetic layer 23 needs to be large.

The adjustment of the interface roughness can be performed by the smoothing treatment of the reverse sputtering with very weak power, surfactant in which the structure is exposed to a low oxygen gas pressure, and the like. For example, voltage is applied to a substrate to generate plasma discharge near the substrate, and Ar ions are drawn into the surface of the substrate, which allows the reverse sputtering to be achieved. "Over 60% TMR at room temperature in MTJ films prepared with surface modification process", K. Tsunekawa et al., Digests of 9th joint MMM/Intermag conference, BD-03 (2004) discloses an example of the reverse sputtering. "Low resistance magnetic tunnel junctions and their interface structures", J. Fujikita et al., J. Appl. Phys. 89 (2001) pp. 7558–60 and "Improvement of MR ratio and reduction of interlayer coupling field in Current-In-Plane spin valve prepared with oxygen surfactant layer", M. Nagai et al., Digests of 9th joint MMM/Intermag conference, FR-07(2004) describes surfactant.

As described above, while the magnetic thicknesses of the first ferromagnetic layer 21 and the second ferromagnetic layer 23 are adjusted and kept, the roughness of the interface between the second ferromagnetic layer 23 and the tunnel barrier layer 13 is set smaller than the roughness of the interfaces included in the interfaces between the antiferromagnetic layer 14 and the first ferromagnetic layer 21 and the interface between the nonmagnetic layer 22 and the second ferromagnetic layer 23. This condition allows the switching magnetic field shift of the recording layer 11 caused by the leakage magnetic field from the fixed layer 12 and the switching magnetic field shift caused by the interface roughness to be substantially eliminated.

(2) FIRST EXAMPLE

Then, various examples will be described. The following MTJ device was produced as a first example. First a NiFeCr of 4 nm thick as a ground layer and a PtMn film of 15 nm thick as the antiferromagnetic layer 14 are formed on the Ta film of 5 nm thick as a seed layer. Then, a $Co_{0.9}Fe_{0.1}$ film of 2.5 nm thick as the first ferromagnetic layer 21, an Ru film of 0.9 nm thick as a nonmagnetic layer 22, and a $Co_{0.75}Fe_{0.25}$ film of 2 nm thick as the second ferromagnetic layer 23 are formed. Then, an Al—O film of 1.2 nm thick as the tunnel barrier layer 13, an NiFe film of 5 nm thick as the recording layer 11, and a Ta film of 5 nm thick as a cap layer are formed. The thickness of the layer to which the reverse sputtering process was applied decreases by 0.2 to 0.4 nm. Therefore, the layer to which the reverse sputtering process is to be applied needs to be thicker than the target thickness (for example, 2 nm for the second ferromagnetic layer 23) by 0.2 to 0.4 nm before the reverse sputtering process. The same holds for other examples described below.

The above structure enables the saturation magnetization of the first ferromagnetic layer 21 and the saturation magnetization of the second ferromagnetic layer 23 to be 1500 emu/cc and 1700 emu/cc, respectively. The surface roughness when layers up to the nonmagnetic layer 22 were formed and the surface roughness when layers up to the second ferromagnetic layer 23 were formed were measured with the atomic force microscope. The average values of the surface roughnesses were 0.35 and 0.4 nm, respectively. The average values of the roughness of the interface between the antiferromagnetic layer 14 and the first ferromagnetic layer 21 and the interface between the first ferromagnetic layer 21 and the nonmagnetic layer 22 were substantially equal to 0.35 nm which was about the value of the roughness of the interface between the nonmagnetic layer 22 and the second ferromagnetic layer 23. After the second ferromagnetic layer 23 was formed, then the reverse sputtering process was applied without taking out the MTJ device from the film forming apparatus. As a result, the average value of the surface roughness decreased from 0.4 to 0.2 nm.

For the purpose of confirmation, the second ferromagnetic layers 23 of different thickness by 1 nm step in a range of 1 to 5 nm were formed, and the switching magnetic field shift caused by the roughness was measured. As a result, the switching magnetic field shift was substantially eliminated when the thickness was 2 nm after the reverse sputtering. With this value, the ratio m2/m1 was 0.85. The switching magnetic field shift caused by the leakage magnetic field was also substantially eliminated.

The device having an elliptical shape of 0.3 μm×0.75 μm and the second ferromagnetic layer 23 of 2 nm thick after the reverse sputtering was formed, and its switching magnetic field was measured. The 1000 devices ware measured to evaluate the fluctuation. The comparative example was also prepared. The comparative example were manufactured in the same process for the devices of the first example except that the reverse sputtering process is not included and the thickness of the second ferromagnetic layer 23 is 3 nm. In the comparative example, since the shift caused by the roughness is 10 Oe, the second ferromagnetic layer 23 is thickened to allow the shift caused by the roughness and with the shift caused by the leakage magnetic field to cancel each other to substantially zero. As a result of the comparison between the first example and the comparative example, the switching magnetic field fluctuation was 5% in the first example while the fluctuation was 10% in comparative example. Thus, it is confirmed that the switching magnetic field fluctuation can decrease by simultaneously eliminating the shift caused by the roughness and the shift caused by the leakage magnetic field.

(3) SECOND EXAMPLE

The following MTJ device was produced as a second example. First a NiFe film of 1.5 nm thick as a ground layer and an IrMn film of 10 nm thick as the antiferromagnetic layer 14 were formed on the Ta film of 5 nm thick as a seed layer. Then, a $Co_{0.6}Ni_{0.3}Fe_{0.1}$ film of 2.5 nm which thick as the first ferromagnetic layer 21, an Ru film of 0.9 nm thick as the nonmagnetic layer 22, and a $Co_{0.9}Fe_{0.1}$ film of 1.8 nm thick as the second ferromagnetic layer 23 were formed. Then, an Al—O film of 1.3 nm thick as the tunnel barrier layer 13, an NiFe film of 5 nm thick as the recording layer 11, and a Ta film of 5 nm thick as a cap layer are formed.

The above structure enables the saturation magnetization of the first ferromagnetic layer 21 and the saturation magnetization of the second ferromagnetic layer 23 to be 1200 and 1500 emu/cc, respectively. The surface roughness when layers up to the nonmagnetic layer 22 were formed and the surface roughness when layers up to the second ferromagnetic layer 23 were formed are measured with the atomic force microscope. The measured result showed that the average values of the surface roughnesses were 0.35 and 0.4 nm, respectively. The average values of the roughness of the interface between the antiferromagnetic layer 14 and the first ferromagnetic layer 21 and the interface between the first ferromagnetic layer 21 and the nonmagnetic layer 22 were substantially equal to 0.35 nm which was about the value of the roughness of the interface between the nonmagnetic layer 22 and the second ferromagnetic layer 23. After the second ferromagnetic layer 23 was formed, then the MJT device was exposed to the low-pressure oxygen gas to obtain the surfactant effect, the average value of the surface roughness decreased from 0.4 to 0.2 nm.

In the second example also, the switching magnetic field fluctuation decreasing effect was observed by the same method as the first example.

(4) THIRD EXAMPLE

The following MTJ device was produced as a third example. First an Ru film of 4 nm thick as a ground layer and a PtMn of 15 nm thick as the antiferromagnetic layer 14 were formed on a Ta film of 5 nm thick as a seed layer. Then, a $Co_{0.6}Ni_{0.3}Fe_{0.1}$ film of 2.5 nm thick as the first ferromagnetic layer 21, an Ru film of 0.9 nm thick as the nonmagnetic layer 22, and an amorphous $Co_{0.6}Fe_{0.2}B_{0.2}$ film of 2.5 nm thick as the second ferromagnetic layer 23 were formed. Then, an Al—O film of 1.3 nm thick as the tunnel barrier layer 13, an NiFe film of 5 nm thick as the recording layer 11, and a Ta film of 5 nm thick as the cap layer were formed. Using amorphous material can form the film whose surface is smoother than that of a non-amorphous material.

The above structure enables the saturation magnetization of the first ferromagnetic layer 21 and the saturation magnetization of the second ferromagnetic layer 23 to be 1000 and 900 emu/cc, respectively. The surface roughness when layers up to the nonmagnetic layer 22 were formed and the surface roughness when layers up to the second ferromagnetic layer 23 were formed were measured with the atomic force microscope. The measured result showed that the average values of the surface roughness decreased to 0.4 and 0.15 nm, respectively. The average values of the roughness of the interfaces included in the interface between the antiferromagnetic layer 14 and the first ferromagnetic layer 21 and the interface between the first ferromagnetic layer 21 and the nonmagnetic layer 22 were substantially equal to 0.4 nm which was about the value of the roughness of the interface between the nonmagnetic layer 22 and the second ferromagnetic layer 23.

In the third example, the switching magnetic field fluctuation decreasing effect was observed by the same method as the first example.

(5) FOURTH EXAMPLE

The following MTJ device was produced as a fourth example. First an Ru film of 4 nm thick as a ground layer and a PtMn film of 15 nm thick as the antiferromagnetic layer 14 were formed on a Ta film of 5 nm thick as a seed layer. Then, a $Co_{0.9}Fe_{0.1}$ film of 2.5 nm thick as the first ferromagnetic layer 21, an Ru film of 0.9 nm thick as the nonmagnetic layer 22, and a laminated structure of a $Co_{0.8}Fe_{0.2}$ film of 1 nm thick and an $Ni_{0.8}Fe_{0.2}$ film of 1 nm thick as the second ferromagnetic layer 23 were formed. Then, an Al—O film of 1.3 nm thick as the tunnel barrier layer 13, an NiFe film of 5 nm thick as the recording layer 11, and the Ta film of 5 nm thick as a cap layer were formed.

The above structure enables the saturation magnetization of the first ferromagnetic layer 21 and the saturation magnetization of the second ferromagnetic layer 23 to be set at 500 and 1300 emu/cc, respectively. Although the two layers are laminated in the second ferromagnetic layer 23, the saturation magnetization of the second ferromagnetic layer 23 is computed in the form of the one layer. The surface roughness when layers up to the nonmagnetic layer 22 were formed and the surface roughness when layers up to the second ferromagnetic layer 23 were formed were measured with the atomic force microscope. The measured result showed that the average values of the surface roughness were 0.35 and 0.4 nm, respectively. The average values of the roughness of the interfaces included in the interface between the antiferromagnetic layer 14 and the first ferromagnetic layer 21 and the interface between the first ferromagnetic layer 21 and the nonmagnetic layer 22 were substantially equal to 0.35 nm which was about the value of the roughness of the interface between the nonmagnetic layer 22 and the second ferromagnetic layer 23. The reverse sputtering process was continuously applied after the second ferromagnetic layer 23 was formed. As a result, the average value of the surface roughness decreased from 0.4 to 0.2 nm.

In the fourth example, the switching magnetic field fluctuation decreasing effect was observed by the same method as the first example.

(6) FIFTH EXAMPLE

The following MTJ device was produced as a fifth example. In the fifth example, the fixed layer 12 includes first to third ferromagnetic layers and first and second nonmagnetic layers. More specifically, in the fixed layer 12, a first ferromagnetic layer 21, a first nonmagnetic layer 31, a second ferromagnetic layer 23, a second nonmagnetic layer 32, and a third ferromagnetic layer 33 are sequentially laminated from the side of an antiferromagnetic layer 14 as shown in FIG. 1B. A tunnel barrier layer 13 is provided on the third ferromagnetic layer 33. The amplitude of the roughness of the interface between the third ferromagnetic layer 33 and the tunnel barrier layer 13 is adjusted so as to be smaller than the amplitudes of the roughness of the interfaces under the interface between the third ferromagnetic layer 33 and the tunnel barrier layer 13.

First a NiFeCr film of 4 nm thick as a ground layer and a PtMn film of 15 nm thick as the antiferromagnetic layer 14 were formed on a Ta film of 5 nm thick as a seed layer. Then, a $Co_{0.9}Fe_{0.1}$ film of 2 nm thick as the first ferromagnetic layer 21, an Ru film of 0.9 nm thick as the first nonmagnetic layer 31, a $Co_{0.9}Fe_{0.1}$ film of 2 nm thick as the second ferromagnetic layer 23, an Ru film of 0.9 nm thick as the second nonmagnetic layer 32, and a $Co_{0.5}Fe_{0.3}Ni_{0.2}$ film of 2 nm thick as the third ferromagnetic layer 33 wee formed. Then, an Al—O film of 1.2 nm thick as the tunnel barrier layer 13, a NiFe film of 5 nm thick as the recording layer 11, and the Ta film of 5 nm thick as a cap layer wee formed. The second ferromagnetic layer 23 and the third ferromagnetic layer 33 are antiferromagnetically coupled through the second nonmagnetic layer 32. The first ferromagnetic layer 21 and the second ferromagnetic layer 23 are antiferromagnetically coupled through the first nonmagnetic layer 31.

The above structure enables the saturation magnetization of the first ferromagnetic layer 21, the saturation magnetization of the second ferromagnetic layer 23, and the saturation magnetization of the third ferromagnetic layer 33 to be set at 1500, 1500, 1300 emu/cc, respectively. The surface roughness when layers up to the second ferromagnetic layer 23 were formed and the surface roughness when layers up to the third ferromagnetic layer 33 were formed were measured with the atomic force microscope. The measured result showed that the average values of the surface roughnesses were 0.4 and 0.5 nm respectively. The reverse sputtering process was continuously applied after the third ferromagnetic layer 33 was formed. As a result, the average value of the surface roughness decreased from 0.5 to 0.2 nm. The average values of the roughness of the interfaces included in the interface between the antiferromagnetic layer 14 and the first ferromagnetic layer 21 to the interface between the first nonmagnetic layer 31 and the second ferromagnetic layer 23 were substantially equal to 0.4 nm which was about the roughness of the interface between the second ferromagnetic layer 23 and the second nonmagnetic layer 32. According to the fifth example, the number of the ferromagnetic layers which are antiferromagnetically coupled are three instead of two, which allows the shift caused by the leakage magnetic field to be finely adjusted while the shift caused by the interface roughness is kept zero.

In the fifth example, the switching magnetic field fluctuation decreasing effect was observed by the same method as the first example.

(7) SIXTH EXAMPLE

The following MTJ device was produced as a sixth example. The MTJ device of the sixth example differs from the MTJ device of the first embodiment only in that the $Co_{0.9}Fe_{0.1}$ film 23a of 0.75 nm thick, the $Co_{0.56}Fe_{0.24}Ta_{0.2}$ film 23b of 1 nm thick, and the $Co_{0.9}Fe_{0.1}$ film 23c of 0.75 nm thick are laminated to form a second ferromagnetic layer 23 as shown in FIG. 1C. The second ferromagnetic layer 23 in which three magnetic layers are laminated behaves as one magnetic layer. Therefore, when the second ferromagnetic layer 23 is viewed as one magnetic layer, the thickness is 5 nm and the saturation magnetization is 1200 emu/cc. Note that the saturation magnetization of each of the $Co_{0.9}Fe_{0.1}$ films 23a and 23c and the $Co_{0.56}Fe_{0.24}Ta_{0.2}$ film 23b is 1500 and 550 emu/cc, respectively.

The surface roughness was measured when layers up to the nonmagnetic layer 22 were formed, when layers up to the $Co_{0.56}Fe_{0.24}Ta_{0.2}$ film 23b were formed and when layers up to the $Co_{0.9}Fe_{0.1}$ film 23c were formed. The measured results showed that the average values of the surface roughnesses were 0.35, 0.4, and 0.42 nm, respectively. The average values of the roughness of the interfaces included in the interface between the antiferromagnetic layer 14 and the first ferromagnetic layer 21 and the interface between the $Co_{0.9}Fe_{0.1}$ film 23a and the $Co_{0.56}Fe_{0.24}Ta_{0.2}$ film 23b were substantially equal to 0.35 nm which was about the value of the roughness of the interface between the nonmagnetic layer 22 and the $Co_{0.9}Fe_{0.1}$ film 23a.

After the $Co_{0.56}Fe_{0.24}Ta_{0.2}$ film 23b was formed, the reverse sputtering process is continuously applied (without taking out the MTJ device from the deposition apparatus). Further, after the $Co_{0.9}Fe_{0.1}$ film 23c was formed, the reverse sputtering process was continuously applied. As a result, the average value of the roughness of the surface of the $Co_{0.56}Fe_{0.24}Ta_{0.2}$ film 23b decreased from 0.4 to 0.2 nm, and the average value of the roughness of the surface of the $Co_{0.9}Fe_{0.1}$ film 23c decreased from 0.42 to 0.22 nm.

In the sixth example, the switching magnetic field fluctuation decreasing effect was observed by the same method as the first example.

(8) APPLICATION EXAMPLE

In the magnetic random access memory according to the invention, the structure of the memory cell can be applied to various types.

APPLICATION EXAMPLE 1

An application Example 1 relates to the case in which an MTJ device 1 according to the embodiment is applied to the memory cell of the magnetic random access memory. FIG. 7 schematically shows an example of a plane layout of a cell array in an MRAM. Bit lines BL for writing and reading and word lines WL (writing word line WWL) extend in the directions different from each other, and typically the bit lines BL and the word lines WL extend in the directions orthogonal to each other. A memory cell MC including the MTJ device 1 is provided at each cross-point of the bit line BL and the word line WL. In the MTJ device 1, a long side of a rectangle is set along the word line WL, a short side is set along the bit line BL, and the magnetization direction is given along the long-side direction. Each bit line BL is electrically connected to one end of each of the MTJ devices 1 in the same column (or row), and each word line WL is arranged so as to be opposite to the other end of each of the MTJ devices 1 in the same row (or column) while brought close to the other end. Each memory cell MC can be formed in the so-called cross-point architecture or in the so-called one-tr+one-MTJ architecture as described below.

A magnetic field Hx from the top toward the bottom of the paper plane is applied to the memory cell MC through which the bit line BL passes by passing write current through the bit line BL from the right toward the left of the paper plane. A magnetic field Hy from the right toward the left of the paper plane is applied to the memory cell MC through which the word line WL passes by passing the write current through the word line WL from the top toward the bottom of the paper plane. The magnetization direction of the recording layer 11 in the MTJ device 1 is switched by applying the two magnetic fields to the MTJ device 1 in the memory cell MC at the cross-point of the bit line BL and the word line WL. Thus, the information is written in the predetermined memory cell MC.

The voltage is applied to the recording layer 11 and the fixed layer 12 in the selected memory cell MC, and a resistance value is read from the current passed through the recording layer 11 and the fixed layer 12, which enables the information to be read. Alternatively, the constant current is passed through the MTJ device 1 in the selected memory cell to read the voltage between the recording layer 11 and the fixed layer 12, which allows the information to be read.

Figure 8:
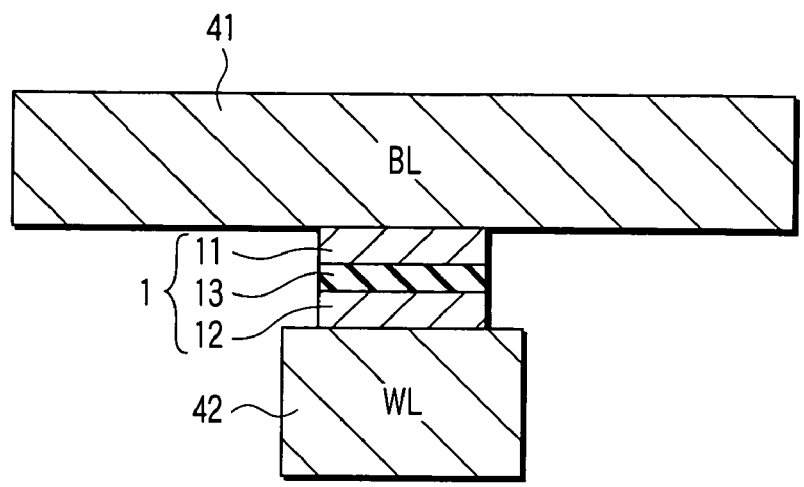
FIG. 8 shows a memory cell having a cross-point architecture.

FIG. 8 shows the case in which the MTJ device 1 according to the embodiment of the invention is applied to the memory cell having the so-called cross-point architecture. As shown in FIG. 8, the memory cell MC includes only the MTJ device 1. One end of the MTJ device 1 is electrically connected to a bit line 41, and the other end of the MTJ device 1 is electrically connected to a word line 42. The bit line 41 and the word line 42 are connected to a driver and a sinker which pass the current through the bit line 41 and the word line 42 in the predetermined direction. The driver and the sinker are connected to a decoder circuit. The decoder circuit controls the driver and the sinker such that the current is passed through the MTJ device 1 according to an address signal supplied from the outside. The bit line BL is also connected to a circuit in a reading system such as a sense-amplifier.

Figure 9:
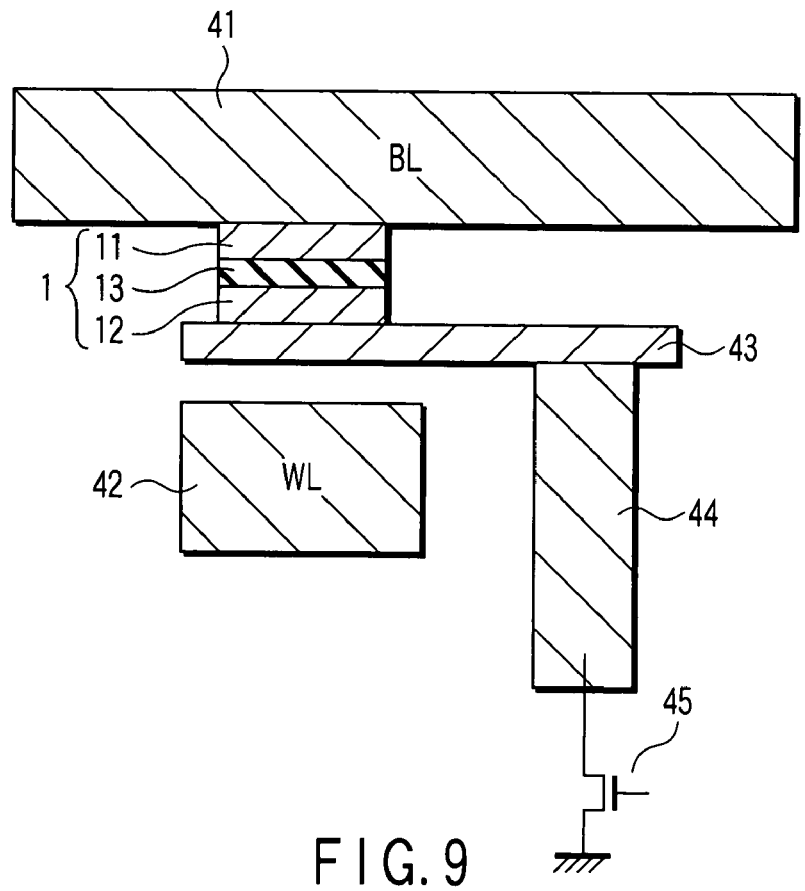
FIG. 9 shows a memory cell having a one-Tr+one-MTJ architecture.

FIG. 9 shows the case in which the MTJ device 1 according to the embodiment of the invention is applied to the memory cell having the so-called one-Tr+one-MTJ architecture. As shown in FIG. 9, the memory cell MC includes the MTJ device 1 and a reading switching element 45 such as a metal oxide semiconductor (MOS) transistor. One end of the MTJ device 1 is electrically connected to the bit line 41, and the other end of the MTJ device 1 is electrically connected to one end of the switching element 45 through an conductive layer 43 and a contact 44. The other end of the switching element 45 is grounded. The word line (writing word line) WL is used in order to pass the current during the writing, and the word line WL is located below the conductive layer 43 while separated from the conductive layer 43. The word line WL is connected to the driver and the sinker which are connected to the decoder. The bit line is connected to the circuit in the reading system such as the driver, the sinker, and the sense-amplifier.

Figure 25:
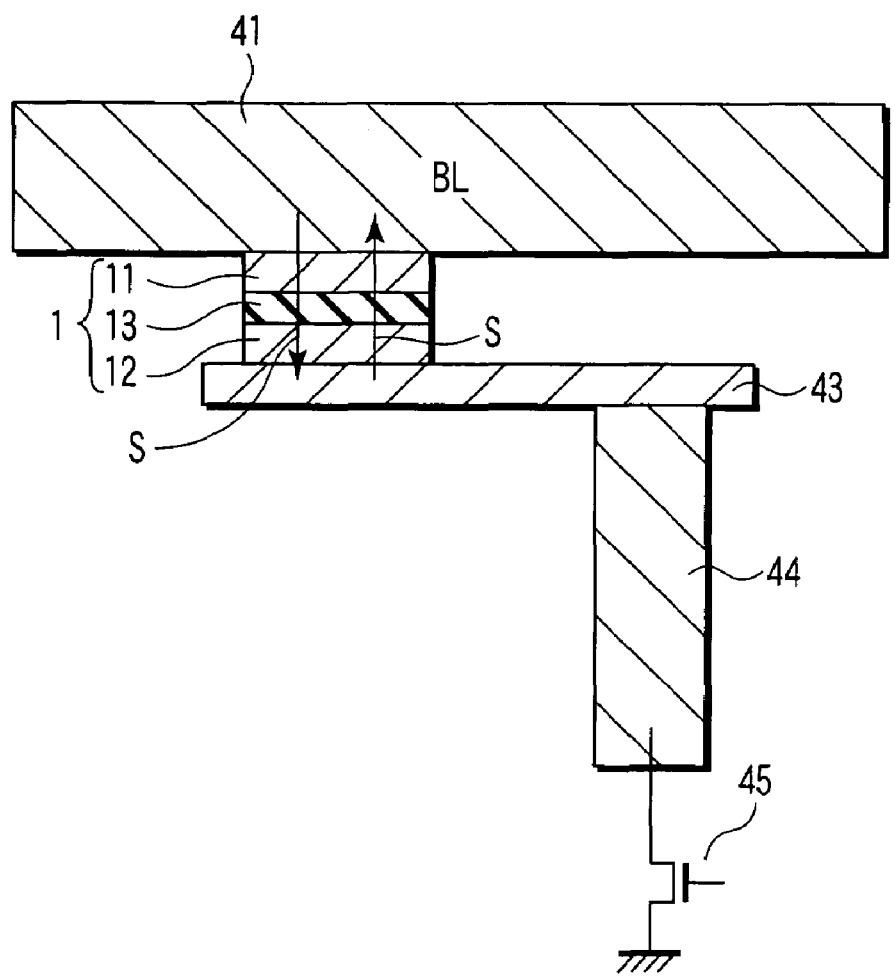
FIG. 25 shows a configuration in which a spin-injection writing is applied to the MTJ device according to the embodiment of the invention.

FIG. 25 shows the configuration in which the so-called spin-injection writing type is applied to the MTJ device 1 according to the embodiment of the invention. The spin-injection writing uses a current direct drive magnetization switching phenomenon. In the current direct drive magnetization switching phenomenon, when a flow of the conduction electrons whose spin is polarized in the opposite direction to the magnetization direction of a magnetic body passes through the magnetic body, spin angular momentum of the conduction electrons act on and transmit to the magnetization of the magnetic body to generate torque, which causes the magnetization switching. The phenomenon can give an influence on a nano-scale magnetic body more directly than using the current magnetic field, and can decrease current necessary for writing as the cell size decreases.

When employing the spin-injection writing type, the write line for generating the current magnetic field is not required. Therefore, as shown in FIG. 25, the word line WL is omitted from the configuration of FIG. 9. In the spin-injection writing type, an electron flow S is supplied in the direction which penetrates the interfaces between the films in the MTJ device. The magnetization direction of the recording layer 11 is switched according to the spin direction at the time when the electron flow S reaches the recording layer 11.

For the MTJ device in which the writing is performed using the spin-injection writing type, the material for the tunnel barrier layer 13 usually differs from the material used in the current magnetic field writing. More specifically, in the spin-injection writing type, examples of the material for the tunnel barrier layer 13 include $Al_2O_3$ (aluminum oxide), $SiO_2$ (silicon oxide), MgO (magnesium oxide), AlN (aluminum nitride), $Bi_2O_3$ (bismuth oxide), $MgF_2$ (magnesium fluoride), CaF2 (calcium fluoride), $SrTiO_2$ (titanium oxide strontium), AlLaO3 (lanthanum oxide aluminum), Al—N—O (aluminum oxinitride), and nonmagnetic semiconductors (ZnO, InMn, Ga, N, GaAs, TiO2, Zn, Te, and material in which transition metal is doped therein).

Further, the writing performed by the current magnetic field and the spin-injection writing can commonly be used with the configuration of FIG. 9. In this case, for example, the writing by the current magnetic field is mainly used, and the spin-injection writing plays an auxiliary role. The same material as the spin-injection type can be used for the tunnel barrier layer 13.

APPLICATION EXAMPLE 2

Figure 10:
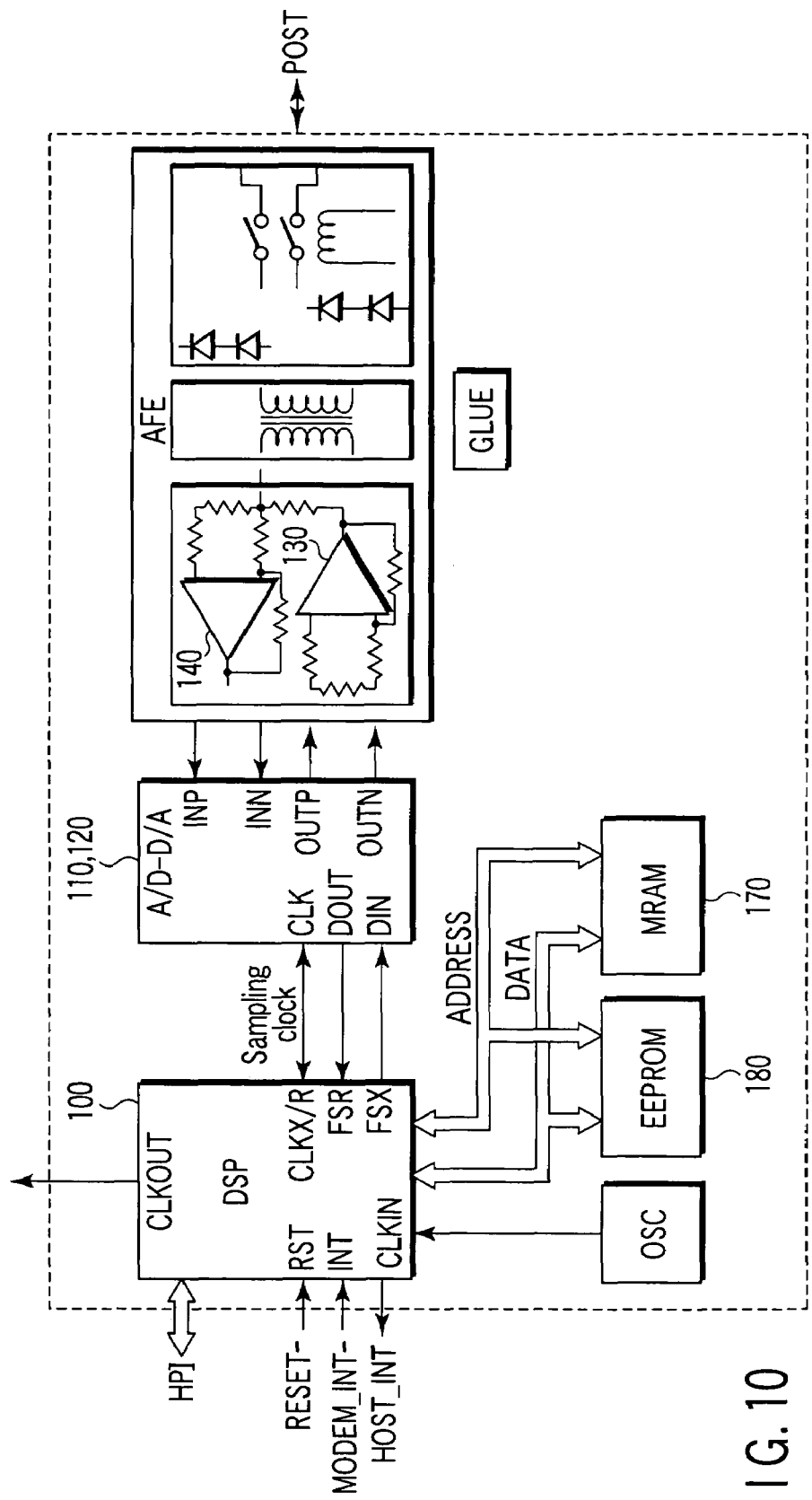
FIG. 10 shows an example block diagram in which the magnetic random access memory according to the embodiment of the invention is applied to a modem.

FIG. 10 shows an example in which the magnetic random access memory according to the embodiment of the invention is applied to a modem, and FIG. 10 is a block diagram showing a data passage portion of a digital subscriber line modem. As shown in FIG. 10, the modem includes a programmable digital signal processor (DSP) 100, an analog-to-digital (A/D) converter 110, a digital-to-analog (D/A) converter 120, a transmission driver 130, and a receiver amplifier 140.

In FIG. 10, a band-pass filter is omitted. Instead of the band-pass filter, various types of option memories are provided in order to hold a line code program which DSP executes. The line code program selects and operates the modem according to the encoded subscriber line information, transmission conditions (line code; QAM, CAP, RSK, FM, AM, PAM, DWMT, and the like), and the like. A magnetic random access memory (MRAM) 170 of the embodiment and the application example 1 is shown as the memory.

In the application example 2, two kinds of memories of the magnetic random access memory 170 and an electrically erasable programmable ROM (EEPROM) 180 are used as the memory for retaining the line code program. However, the EEPROM 180 may be replaced with the MRAM. That is, two kinds of memories are not used, but only the MRAMs are used.

APPLICATION EXAMPLE 3

Figure 11:
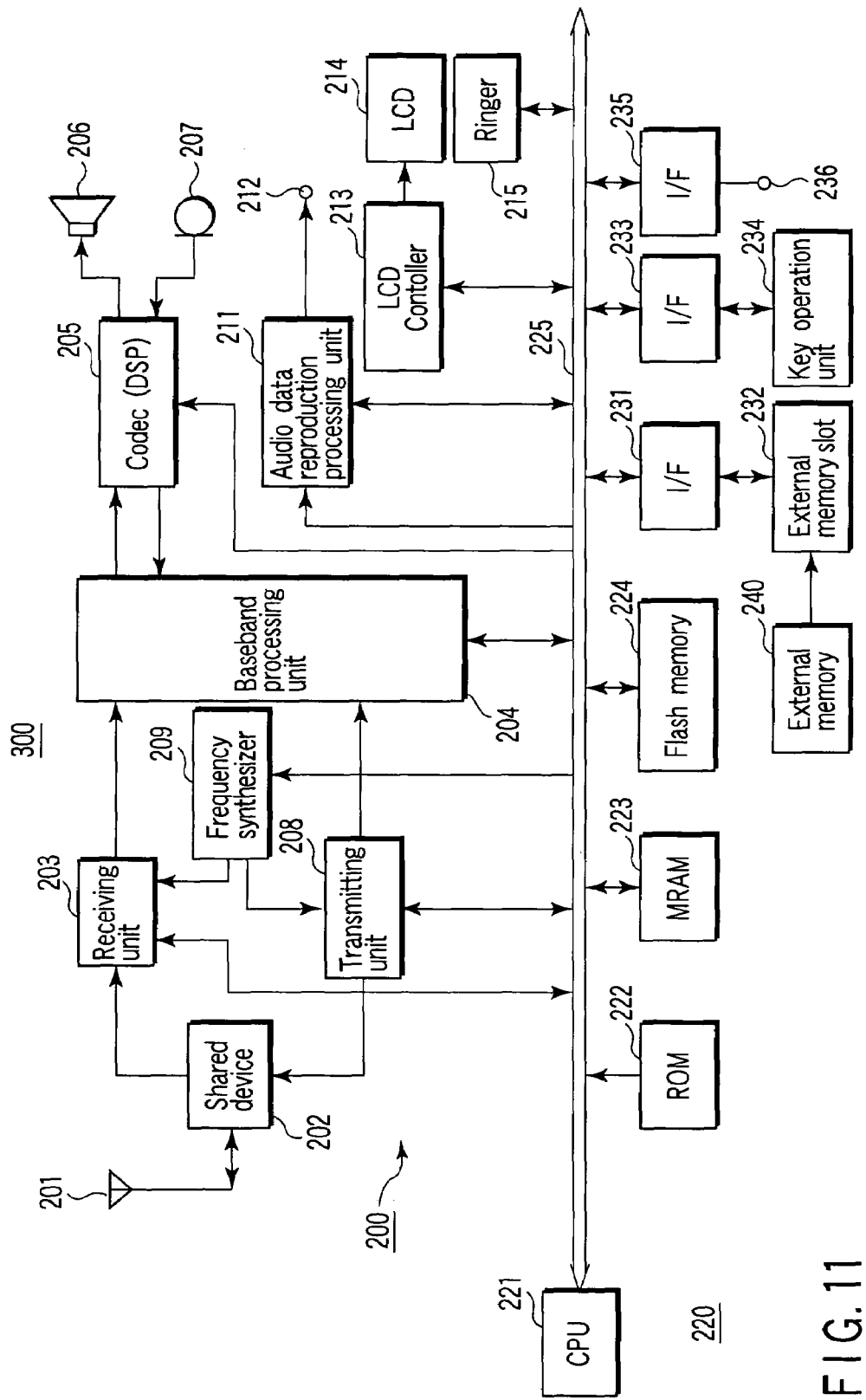
FIG. 11 shows an example block diagram in which the magnetic random access memory according to the embodiment of the invention is applied to a portable telephone device.

FIG. 11 shows an example in which the magnetic random access memory according to the embodiment of the invention is applied to a portable telephone device. As shown in FIG. 11, a communication unit 200 which realizes communication function includes a transmitting and receiving antenna 201, an antenna sharing device 202, a receiving unit 203, a baseband processing unit 204, a DSP 205 used as an audio codec, a speaker (receiver) 206, a microphone (transmitter) 207, a transmitting unit 208, and a frequency synthesizer 209.

A portable telephone device 300 includes a control unit 220 which controls each unit of the portable telephone device. The control unit 220 is a microcomputer which is formed by connecting a central processing unit (CPU) 221, a ROM 222, a magnetic random access memory (MRAM) 223 according to the embodiment and the application example 1, and a flash memory 224 to one another through a CPU bus 225. A program executed in the CPU 221 and data necessary to a display font and the like are stored in the ROM 222 in advance.

The MRAM 223 is mainly used as a working area. While the CPU executes the program, the data under computation and the like are stored in the MRAM 223 if necessary, and the data exchanged between the control unit 220 and each unit is temporarily stored in the MRAM. The setting conditions just prior to power-off are stored in the flash memory 224 even if the power of the portable telephone device 300 is turned off. When the same settings are used in the next power turn-on, the setting parameters stored in the flash memory 224 are used. Therefore, even if the power of the portable telephone device is turned off, the setting parameters stored in the flash memory 224 are never erased.

The portable telephone device 300 also includes an audio data reproduction processing unit 211, an external output terminal 212, a liquid crystal display (LCD) controller 213, a display LCD 214, and a ringer 215 which emits a beep sound. The audio data reproduction processing unit 211 reproduces audio data (or audio data stored in the external memory 240 which is to be mentioned later) input to the portable telephone device 300. The reproduced audio data is taken out to the outside by transmitting the reproduced audio data to a head phone, a portable speaker, or the like through the external output terminal 212. For example, the LCD controller 213 receives display information from the CPU 221 through the CPU bus 225 to convert the display information into LCD control information for controlling the LCD 214. The LCD 214 is driven by the LCD control information to display the information.

Further, the portable telephone device 300 includes interface (I/F) circuits 231, 233, and 235, an external memory 240, an external memory slot 232, a key operation unit 234, and an external input and output terminal 236. The external memory 240 such as a memory card is inserted into the external memory slot 232. The external memory slot 232 is connected to the CPU bus 225 through the interface circuit 231. Thus, when the slot 232 is provided in the portable telephone device 300, the information inside the portable telephone device 300 can be written in the external memory 240, or the information (for example, audio data) stored in the external memory 240 can be input to the portable telephone device 300. The key operation unit 234 is connected to the CPU bus 225 through the interface circuit 233. Key input information input from the key operation unit 234 is transmitted to, e.g., the CPU 221. The external input and output terminal 236 is connected to the CPU bus 225 through the interface circuit 235. The external input and output terminal 236 functions as the terminal, when various kids of pieces of information are input from the outside to the portable telephone device 300, or when the information is output to the outside from the portable telephone device 300.

Although the ROM 222, the MRAM 223, and the flash memory 224 are used in the application example 3, both the ROM 222 and the flash memory 224 or either the ROM 222 or the flash memory 224 can also be replaced with the MRAM.

APPLICATION EXAMPLE 4

FIGS. 12 to 16 show an example in which the magnetic random access memory according to the embodiment of the invention is applied to a card (MRAM card) in which media contents such as smart media are stored.

Figure 12:
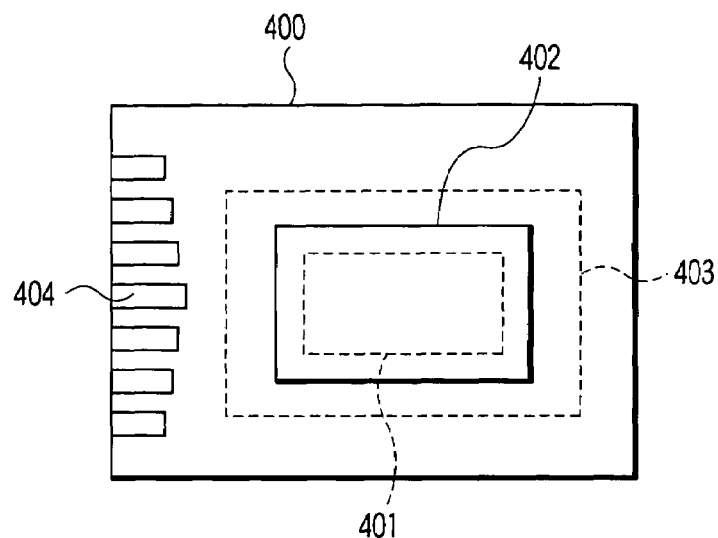
FIG. 12 shows an example top view in which the magnetic random access memory according to the embodiment of the invention is applied to a card (MRAM card) in which media contents such as smart media is stored.

As shown in FIG. 12, An MRAM chip 401 is built in an MRAM card main body 400. In the MRAM card main body 400, an opening 402 is formed at a position corresponding to the MRAM chip 401, and the MRAM chip 401 is exposed. A shutter 403 is provided in the opening 402, and the MRAM chip 401 is protected by the shutter 403 when the MRAM card is brought along. The shutter 403 is made of the material having a shield effect against the external magnetic field, e.g., ceramic. When the data is transferred, the shutter 403 is opened to expose the MRAM chip 401. An external terminal 404 takes out the content data stored in the MRAM card to the outside.

Figures 13, 14:
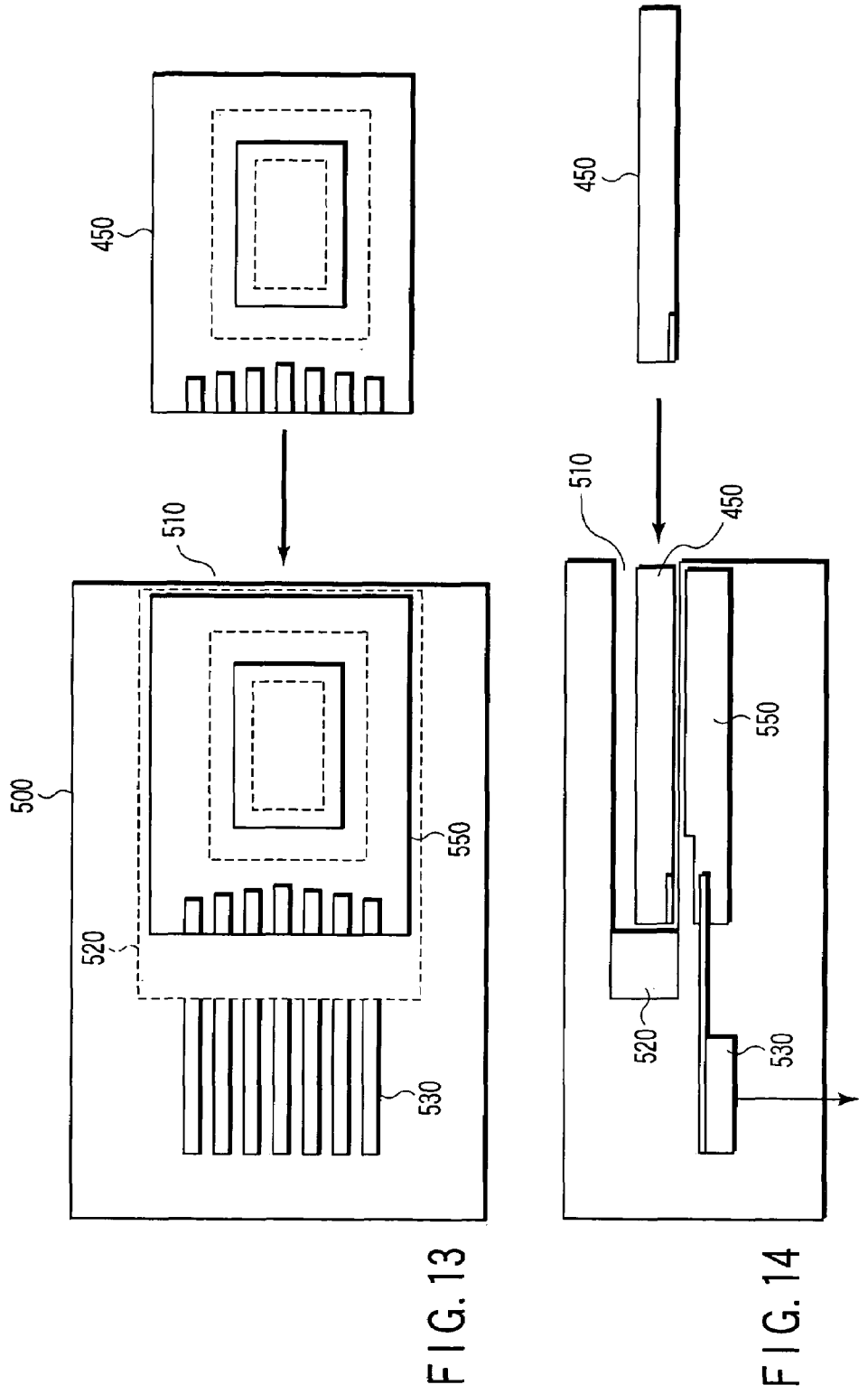
FIG. 13 shows a plan view of a transfer device which transfers data to the MRAM card.
FIG. 14 shows a sectional view of the transfer device which transfers the data to the MRAM card.

FIGS. 13 and 14 are a plan view and a sectional view showing a card insert type transfer device which transfers the data to the MRAM card respectively. A second MRAM card 450 used by an end user is inserted from an insertion portion 510 of a transfer device 500 as shown by an arrow, and the second MRAM card 450 is pressed into until the second MRAM card 450 is stopped by a stopper 520. The stopper 520 also acts as a member which aligns a first MRAM 550 and the second MRAM card 450 with each other. When the second MRAM card 450 is arranged at a predetermined position, a control signal is supplied to an external terminal 530 from a first MRAM data update control unit to transfer the data, stored in the first MRAM 550, to the second MRAM card 450.

Figure 15:
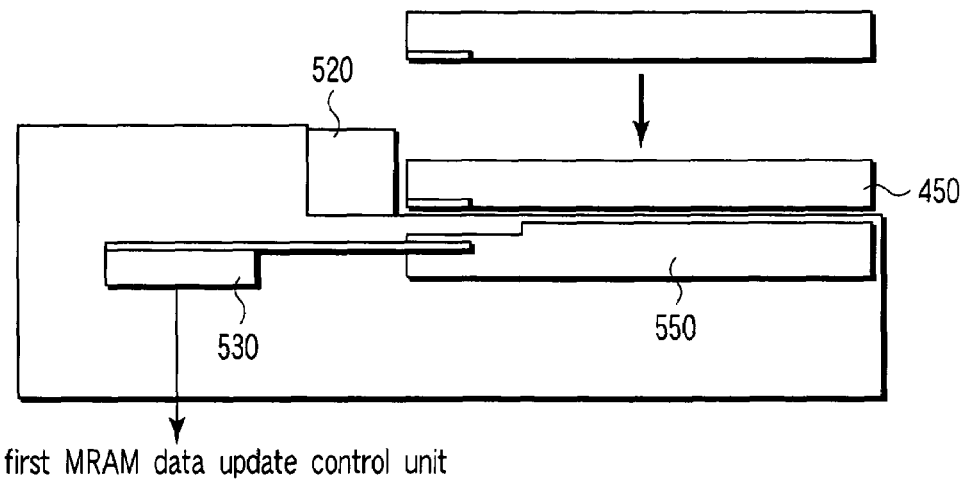
FIG. 15 shows a sectional view of a set-in type transfer device which transfers the data to the MRAM card.

FIG. 15 is a sectional view showing a set-in type transfer device. The set-in type transfer device is one in which the second MRAM card 450 is placed on the first MRAM 550 so as to be set in the first MRAM 550 as shown by the arrow while the stopper 520 is the target. The transfer method is similar to the card insert type, so that the description will be omitted.

Figure 16:
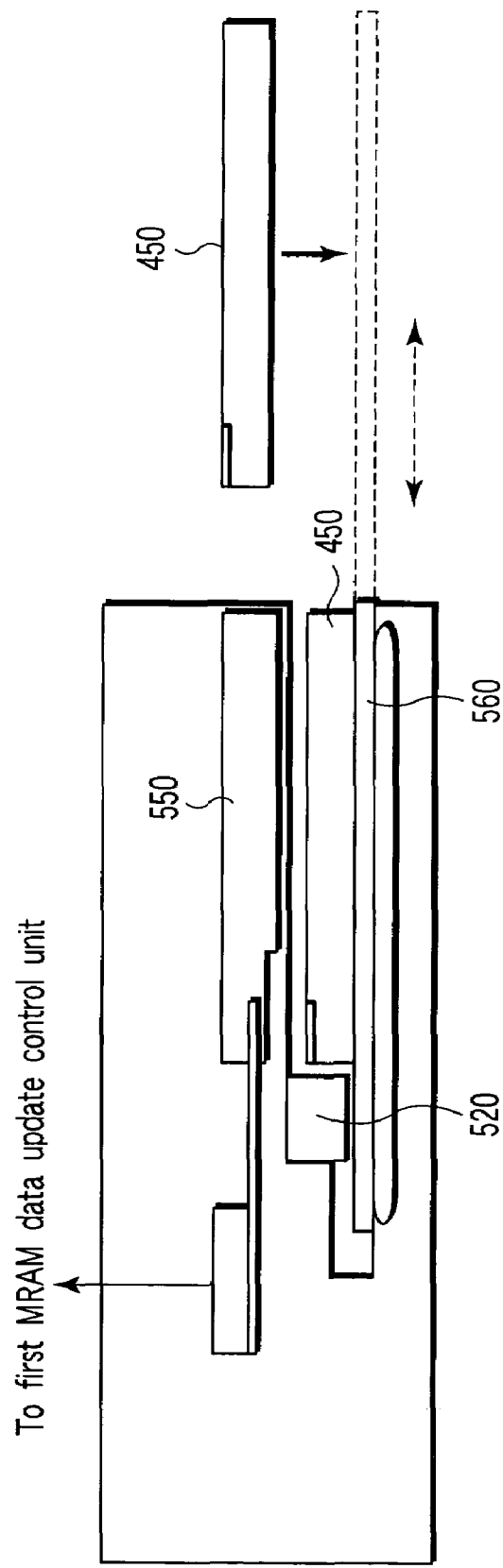
FIG. 16 shows a sectional view of a slide type transfer device which transfers the data to the MRAM card.

FIG. 16 shows a slide type transfer device. In the slide type transfer device, a backing slide 560 is provided in the transfer device 500 like a CD-ROM drive and a DVD drive. The backing slide 560 is moved in the direction shown by the arrow. The second MRAM card 450 is placed on the backing slide 560 when the backing slide 560 is moved to the position shown by the broken line, and the second MRAM card 450 is delivered to the inside of the transfer device 500. The slide type transfer device is similar to the card insert type transfer device in the delivery method, in which the second MRAM card 450 is delivered such that the leading portion of the second MRAM card 450 abuts on the stopper 520, and in the transfer method. Therefore, the description will be omitted.

As described above, in the magnetic random access memory according to the embodiment of the invention, the roughness of the interface between the second ferromagnetic layer 23 and the tunnel barrier layer 13 is set smaller than the roughness of the interfaces included in the interface between the antiferromagnetic layer 14 and the first ferromagnetic layer 21 and the interface between nonmagnetic layer 22 and the second ferromagnetic layer 23 while the magnetic thickness of the first ferromagnetic layer 21 and the second ferromagnetic layer 23 remain adjusted. Therefore, in the synthetic pin structure, the switching magnetic field shift of the recording layer 11 caused by the leakage magnetic field from the fixed layer 12 and the switching magnetic field shift caused by the interface roughness can substantially be eliminated at the same time. Accordingly, the laminated structure having the resistance against the processing fluctuation and the thickness fluctuation is formed, which allows the switching magnetic field fluctuation to decrease.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive effect device comprising:
   a first ferromagnetic layer having a fixed magnetization direction and having magnetic moment m1 per unit area;
   a nonmagnetic layer contacting with the first ferromagnetic layer, having an amplitude h1 of roughness of an interface between the nonmagnetic layer and the first ferromagnetic layer;

a second ferromagnetic layer contacting with the nonmagnetic layer on an opposite side to the first ferromagnetic layer, having a fixed magnetization direction, having magnetic moment m2 per unit area which is smaller than the magnetic moment m1, and having an amplitude h2 of roughness of an interface between the second ferromagnetic layer and the nonmagnetic layer;

a barrier layer contacting with the second ferromagnetic layer on an opposite side to the nonmagnetic layer, and having an amplitude h3 of roughness of an interface between the barrier layer and the second ferromagnetic layer, the amplitude h3 being smaller than the amplitudes h1 and h2; and a third ferromagnetic layer contacting with the barrier layer on an opposite side to the second ferromagnetic layer and having a variable magnetization direction.

2. The device according to claim 1, wherein (m2/m1) is 0.5 or more.

3. The device according to claim 1, further comprising an antiferromagnetic layer contacting with the first ferromagnetic layer on an opposite side to the nonmagnetic layer and being made of an alloy containing Mn, a crystal surface of the antiferromagnetic layer being preferentially orientated toward (111) surface.

4. The device according to claim 1, further comprising an antiferromagnetic layer contacting with the first ferromagnetic layer on an opposite side to the nonmagnetic layer and having an amplitude h4 of roughness of an interface between the antiferromagnetic layer and the first ferromagnetic layer, the amplitude h4 being larger than the amplitude h3.

5. The device according to claim 1, wherein the second ferromagnetic layer is substantially made of an amorphous material.

6. The device according to claim 1, wherein at least one of the first ferromagnetic layer and the second ferromagnetic layer has at least two magnetic layers which are laminated, and magnetization directions of the magnetic layers are orientated parallel to each other by ferromagnetic coupling.

7. A magnetic random access memory comprising:
a magnetoresistive effect device which comprises
a first ferromagnetic layer having a fixed magnetization direction and having magnetic moment m1 per unit area,
a nonmagnetic layer contacting with the first ferromagnetic layer and having an amplitude h1 of roughness of an interface between the nonmagnetic layer and the first ferromagnetic layer,
a second ferromagnetic layer contacting with the nonmagnetic layer on an opposite side to the first ferromagnetic layer, having a fixed magnetization direction, having magnetic moment m2 per unit area which is smaller than the magnetic moment m1, and having an amplitude h2 of roughness of an interface between the second ferromagnetic layer and the nonmagnetic layer,
a barrier layer contacting with the second ferromagnetic layer on an opposite side to the nonmagnetic layer and having an amplitude h3 of roughness of an interface between the barrier layer and the second ferromagnetic layer, the amplitude h3 being smaller than the amplitudes h1 and h2, and
a third ferromagnetic layer contacting with the barrier layer on an opposite side to the second ferromagnetic layer and having a variable magnetization direction;

a first wiring electrically connected to the first ferromagnetic layer or the third ferromagnetic layer; and
a second wiring sandwiching the magnetoresistive effect device with the first wiring.

8. The memory according to claim 7, wherein (m2/m1) is 0.5 or more.

9. The memory according to claim 7, further comprising an antiferromagnetic layer contacting with the first ferromagnetic layer on an opposite side to the nonmagnetic layer and being made of an alloy containing Mn, a crystal surface of the antiferromagnetic layer being preferentially orientated toward (111) surface.

10. The memory according to claim 7, further comprising an antiferromagnetic layer contacting with the first ferromagnetic layer on an opposite side to the nonmagnetic layer and having an amplitude h4 of roughness of an interface between the antiferromagnetic layer and the first ferromagnetic layer, the amplitude h4 being larger than the amplitude h3.

11. The memory according to claim 7, wherein the second ferromagnetic layer is substantially made of an amorphous material.

12. The memory according to claim 7, wherein at least one of the first ferromagnetic layer and the second ferromagnetic layer has at least two magnetic layers which are laminated, and magnetization directions of the magnetic layers are orientated parallel to each other by ferromagnetic coupling.

13. The memory according to claim 7, wherein the second wiring is electrically insulated from the magnetoresistive effect device.

14. The memory according to claim 7, wherein the second wiring is electrically connected to the magnetoresistive effect device.

15. A magnetoresistive effect device manufacturing method comprising:
forming a first ferromagnetic layer having a fixed magnetization direction and having magnetic moment m1 per unit area;
forming a nonmagnetic layer on the first ferromagnetic layer;
forming a second ferromagnetic layer on the nonmagnetic layer, the second ferromagnetic layer having a fixed magnetization direction and having magnetic moment m2 per unit area which is smaller than the magnetic moment m1;
smoothing a surface of the second ferromagnetic layer on an opposite side to the nonmagnetic layer;
forming a barrier layer on the second ferromagnetic layer; and
forming a third ferromagnetic layer on the barrier layer, the third ferromagnetic layer having a variable magnetization direction.

16. The method according to claim 15, further comprising forming an antiferromagnetic layer, and wherein forming the first ferromagnetic layer includes forming the first ferromagnetic layer on the antiferromagnetic layer.

17. The method according to claim 15, wherein forming the second ferromagnetic layer includes forming the second ferromagnetic layer which has magnetic moment m2 per unit which makes (m2/m1) 0.5 or more.

* * * * *